(12) United States Patent
Ting et al.

(10) Patent No.: US 10,978,609 B2
(45) Date of Patent: Apr. 13, 2021

(54) DISPLAY DEVICE, METHOD OF MANUFACTURING THE SAME AND SUBSTRATE OF THE SAME

(71) Applicant: PLAYNITRIDE INC., Zhubei (TW)

(72) Inventors: Tzu-Yu Ting, Zhubei (TW); Yu-Hung Lai, Zhubei (TW); Hsiang-Wen Tang, Zhubei (TW); Yi-Chun Shih, Zhubei (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 16/541,055

(22) Filed: Aug. 14, 2019

(65) Prior Publication Data
US 2020/0091370 A1 Mar. 19, 2020

(30) Foreign Application Priority Data
Sep. 14, 2018 (TW) ................. 107132492

(51) Int. Cl.
*H01L 33/00* (2010.01)
*H01L 27/15* (2006.01)
*G09F 9/33* (2006.01)

(52) U.S. Cl.
CPC .............. *H01L 33/005* (2013.01); *G09F 9/33* (2013.01); *H01L 27/156* (2013.01); *H01L 2933/0016* (2013.01); *H01L 2933/0066* (2013.01)

(58) Field of Classification Search
CPC ... G09F 9/33; G09F 9/40; G09F 9/372; G09F 9/375; H01L 21/00
See application file for complete search history.

(56) References Cited

U.S. PATENT DOCUMENTS

| | | | |
|---|---|---|---|
| 6,780,696 B1 * | 8/2004 | Schatz | H01L 24/95 257/688 |
| 7,323,757 B2 * | 1/2008 | Fonstad, Jr. | H01L 21/2007 257/421 |
| 2007/0231826 A1 * | 10/2007 | Huber | H01L 24/14 435/7.1 |

* cited by examiner

*Primary Examiner* — Peniel M Gumedzoe
(74) *Attorney, Agent, or Firm* — JCIPRNET

(57) ABSTRACT

A method of manufacturing display device is disclosed. a substrate includes a basal layer and metal contacts on the top surface. An insulation layer is disposed on the top surface and includes a first mounting surface and a bottom surface. Multiple grooves are formed on the insulation layer and each extends from the first mounting surface to the bottom surface. The grooves respectively correspond to the metal contacts and expose respective metal contacts. An electromagnetic force is provided with a direction from the basal layer toward the insulation layer. A droplet containing multiple micro components is provided on the first mounting surface. A configuration of an electrode of the micro component corresponds to a configuration of one of the grooves. The electrode is attracted to the corresponding groove by the electromagnetic force so as to electrically contact the metal contact.

9 Claims, 24 Drawing Sheets

DISPLAY DEVICE, METHOD OF MANUFACTURING THE SAME AND SUBSTRATE OF THE SAME

CROSS-REFERENCE TO RELATED APPLICATIONS

This non-provisional application claims priority under 35 U.S.C. § 119(a) on Patent Application No(s). 107132492 filed in Taiwan, R.O.C. on Sep. 14, 2018, the entire contents of which are hereby incorporated by reference.

BACKGROUND

1. Technical Field

This present disclosure relates to a display device, more particularly to a display device including micro components, a method of manufacturing this display device and a substrate of this display device.

2. Related Art

Light emitting diodes (LED) have the advantages of high energy conversion efficiency, compact size and long service life, and thus have been widely used in various electronic products, such as indicators, illumination apparatus and displays, to provide images. In brief, a light emitting diode includes a light emitting layer and at least two semiconductor layers, and the semiconductor layers is provided for emitting light with different colors. By adjusting the material used for the light emitting layer and the semiconductor layer, light emitting diodes with various colors of light can be manufactured.

The miniaturization of light emitting diodes is given high attention and considered as a new semiconductor technology in the next generation. Concerning current technology, the light emitting diode has been able to be miniaturized down to micron size. In some display panel processes, a plurality of light emitting diodes are mass transferred to a substrate on which a driver circuit is fabricated. However, since the light emitting diode becomes smaller as the development of technology, it is difficult and costly to classify the micro light emitting diodes according to the color of light in the mass transfer process.

SUMMARY

According to one aspect of the present disclosure, a method of manufacturing display device is disclosed. a substrate is provided, and the substrate includes a basal layer and a plurality of metal contacts located on the top surface. An insulation layer is disposed on the top surface of the basal layer. The insulation layer includes a first mounting surface and a bottom surface, the first mounting surface is opposite to the basal layer, and the bottom surface faces the basal layer. A plurality of grooves are formed on the insulation layer. each of the grooves extends from the first mounting surface to the bottom surface. The grooves respectively correspond to the metal contacts, and the grooves expose respective metal contacts. at least one electromagnetic force is provided, and a direction of the electromagnetic force is from the basal layer toward the insulation layer. A droplet containing a plurality of micro components is provided on the first mounting surface. Each of the micro components includes an electrode, and a configuration of the electrode corresponds to a configuration of one of the grooves. The electrode is attracted to the corresponding groove by the electromagnetic force, such that the electrode electrically contacts the metal contact which the corresponding groove exposes.

According to another aspect of the present disclosure, a substrate includes a basal layer and an insulation layer. The basal layer includes a top surface and a plurality of metal contacts located on the top surface. The insulation layer is disposed on the top surface of the basal layer. The insulation layer includes a first mounting surface, a bottom surface and a plurality of grooves. The first mounting surface is opposite to the bottom surface, the first mounting surface is opposite to the basal layer, and the bottom surface faces the basal layer. Each of the grooves extends from the first mounting surface to the bottom surface. The grooves respectively correspond to the metal contacts, and the grooves expose respective metal contacts. Each of the grooves is configured to accommodate an electrode of a micro component so as to make the electrode electrically contact the metal contact which the corresponding groove exposes.

According to still another aspect of the present disclosure, a display device includes a basal layer, an insulation layer and a plurality of micro components. The basal layer includes a top surface and a plurality of metal contacts located on the top surface. The insulation layer is disposed on the top surface of the basal layer. The insulation layer includes a first mounting surface, a bottom surface and a plurality of grooves. The first mounting surface is opposite to the bottom surface, the first mounting surface is opposite to the basal layer, and the bottom surface faces the basal layer. Each of the grooves extends from the first mounting surface to the bottom surface. The grooves respectively correspond to the metal contacts, and the grooves expose respective metal contacts. Each of the micro components includes an electrode fitted into one of the grooves, and the electrode electrically contacts the metal contact which the corresponding groove exposes.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Embodiments of the present disclosure describe a structure related to micro components such as micro light emitting diode (LED) devices and microchips. The micro components are on a carrier substrate so that they are poised for pick up and transfer to a receiving substrate. For example, the receiving substrate may be, but is not limited to, a display substrate, a lighting substrate, a substrate with functional devices such as transistors or integrated circuits (ICs), or a substrate with metal redistribution lines. While embodiments of the present invention are described with specific regard to micro LED devices comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser).

The term "micro component" as used herein may refer to a micro LED device with descriptive size in accordance with embodiments of the disclosure. As used herein, the term "micro component" means that the micro component has a maximum size of smaller than 100 micrometers (μm). In this manner, it is possible to integrate and assemble micro LED devices into heterogeneously integrated systems, including substrates of any size ranging from micro displays to large area displays, and at high transfer rates. In some embodiments without a drawing for reference, the micro component may be, but is not limited to, a micro IC, a micro LD or a micro sensor.

The term "substrate" as used herein may refer to a printed Circuit board (PCB), a flexible printed circuit board (FPCB), a thin-film-transistor (TFT) glass backboard, a glass backboard with conductive wires, a PCB with ICs or other substrate having working circuit.

Figure 1:
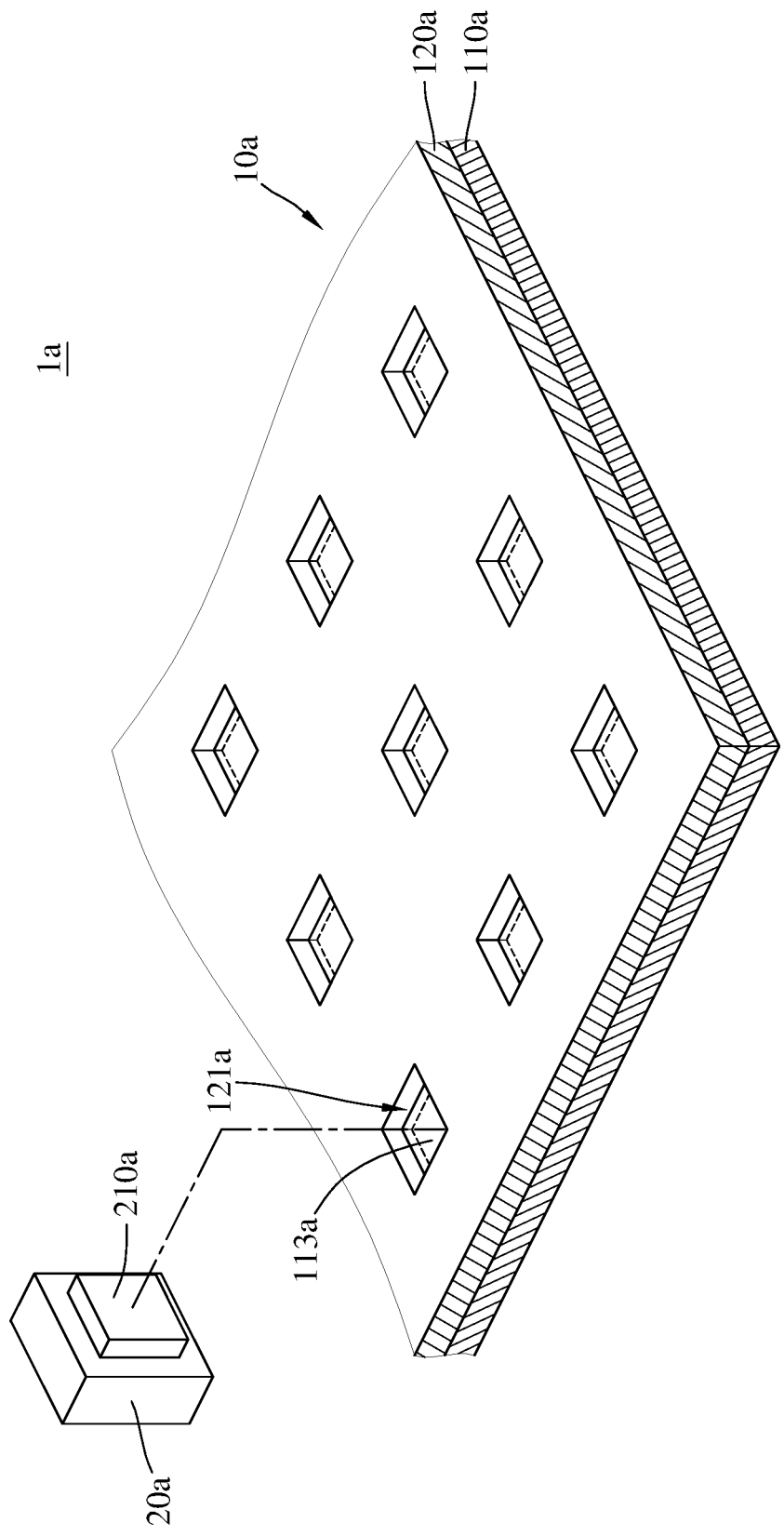
FIG. 1 is an exploded view of a display device according to one embodiment of the present disclosure.
Figure 2:
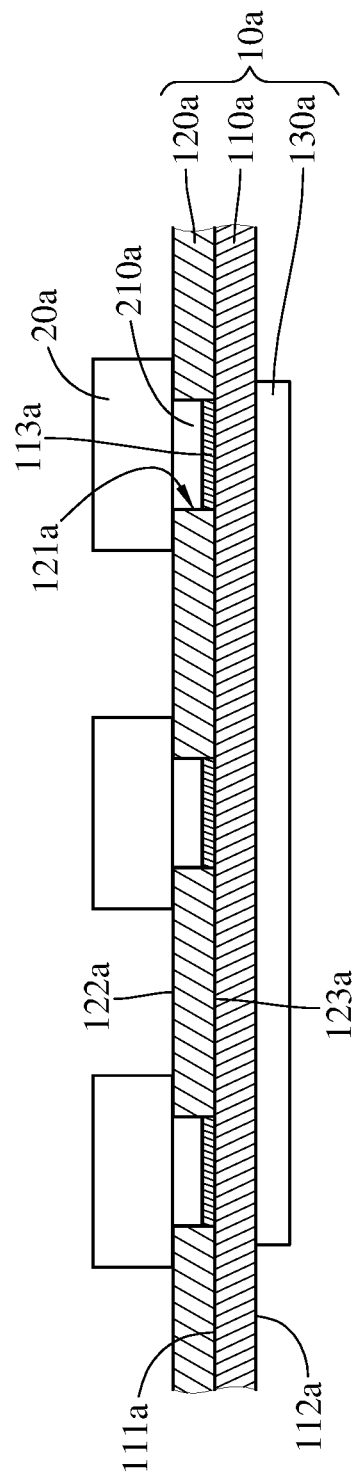
FIG. 2 is a cross-sectional view of the display device in FIG. 1.

Please refer to FIG. 1 and FIG. 2. FIG. 1 is an exploded view of a display device according to one embodiment of the present disclosure. FIG. 2 is a cross-sectional view of the display device in FIG. 1. In this embodiment, a display device 1a includes a substrate 10a and a plurality of micro components 20a. It is worth noting that the present disclosure is not limited to the number of the micro components 20a.

The substrate 10a includes a basal layer 110a, an insulation layer 120a and an electromagnetic generator 130a. The basal layer 110a includes a top surface 111a, a mounting surface 112a and a plurality of metal contacts 113a, and the metal contacts 113a are located on the top surface 111a. The top surface 111a and the mounting surface 112a are opposite surfaces of the basal layer 110a. The metal contact 113a, for example, is a conductive metal pad protruding from the top surface 111a.

The insulation layer 120a, for example, is an electrically non-conductive polymer such as aluminum oxide ($Al_2O_3$), silicon dioxide ($SiO_2$), aluminum nitride (AlN), silicon nitride and so on. The insulation layer 120a is disposed on the top surface 111a of the basal layer 110a, and the insulation layer 120a has a thickness of 1-3 μm. An overly thick insulation layer 120a may influence bonding yield rate, and an overly thin insulation layer 120a may cause a problem of worse insulating ability. The insulation layer 120a includes a plurality of grooves 121a, a mounting surface 122a and a bottom surface 123a. The mounting surface 122a is opposite to the bottom surface 123a. The mounting surface 122a is opposite to the basal layer 110a, and the bottom surface 123a faces the basal layer 110a. Each of the grooves 121a extends from the mounting surface 122a to the bottom surface 123a so as to penetrate through the insulation layer 120a. The grooves 121a respectively correspond to the metal contacts 113a on the basal layer 110a, and the grooves 121a expose respective metal contacts 113a. In this embodiment, each of the grooves 121a is a rectangular single hole, but the present disclosure is not limited thereto. In some other embodiments, each groove includes two sub grooves spaced apart from each other, each metal contact includes two sub contacts spaced apart from each other, and the sub grooves expose respective sub contacts.

The electromagnetic generator 130a is disposed on the mounting surface 112a of the basal layer 110a, and the electromagnetic generator 130a corresponds to the grooves 121a in order to provide electromagnetic force along a direction from the basal layer 110a toward the insulation layer 120a. In one embodiment, the electromagnetic generator 130a includes multiple conductive wires electrically connected with respective metal contacts 113a. In another embodiment, the electromagnetic generator 130a is a single coil spaced apart from the metal contacts 113a. In still another embodiment, the electromagnetic generator 130a includes a plurality of coils, and the coils respectively correspond to the metal contacts 113a.

Each of the micro components 20a, for example, is a red LED including an electrode 210a. The electrode 210a of each of the micro components 20a is fitted into one of the grooves 121a, and the electrode 210a electrically contacts the metal contact 113a which the corresponding groove 121a exposes.

Figure 3:
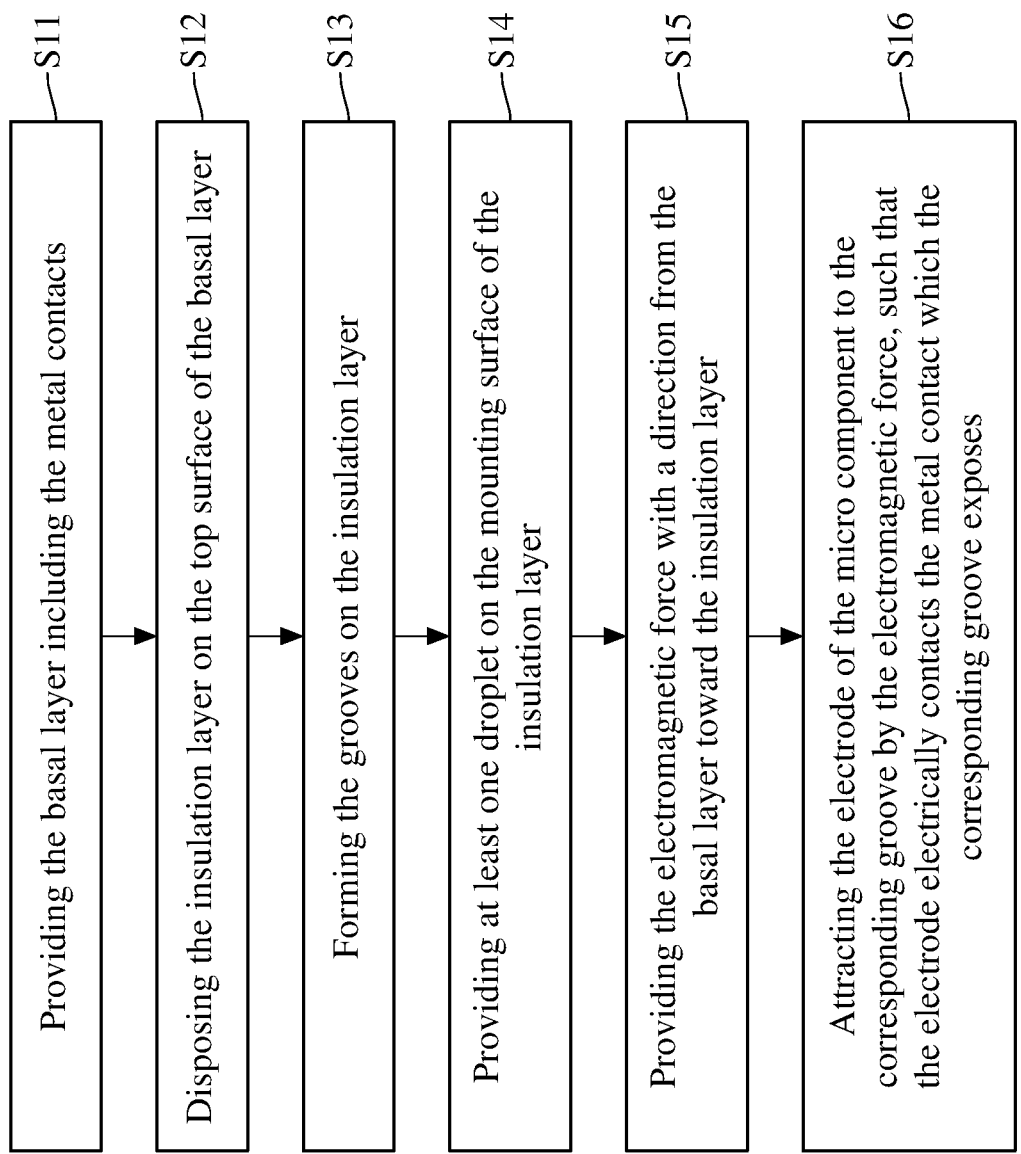
FIG. 3 is a flow chart of a method of manufacturing the display device in FIG. 2, according to a first embodiment of the present disclosure.

FIG. 3 is a flow chart of a method of manufacturing the display device in FIG. 2, according to the first embodiment of the present disclosure. FIG. 4 through FIG. 7 are schematic views showing manufacturing of the display device in FIG. 2. In this embodiment, a method of manufacturing display device includes steps S11 through S16.

In the step S11, the basal layer 110a including the metal contacts 113a is provided.

In the step S12, the insulation layer 120a is disposed on the top surface 111a of the basal layer 110a. The basal layer 110a and the insulation layer 120a jointly form the substrate 10a of the display device.

Figure 4:
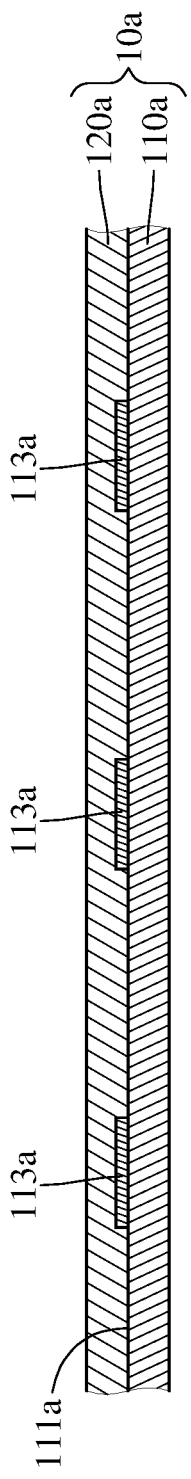
FIG. 4 through FIG. 7 are schematic views showing a method of manufacturing the display device in FIG. 2, according to the first embodiment of the present disclosure.
Figure 5:
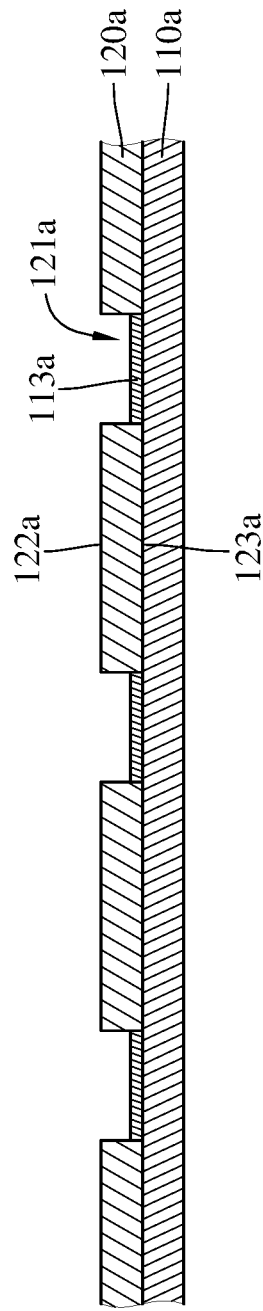

In the step S13, the grooves 121a are formed on the insulation layer 120a. Each groove 121a extends from the mounting surface 122a to the bottom surface 123a of the insulation layer 120a. The grooves 121a expose respective metal contacts 113a of the basal layer 110a. As shown in FIG. 4 and FIG. 5, in this embodiment, a photolithography process and an etching process may be performed to remove part of the insulation layer 120a, thereby forming the grooves 121a.

Figure 6:
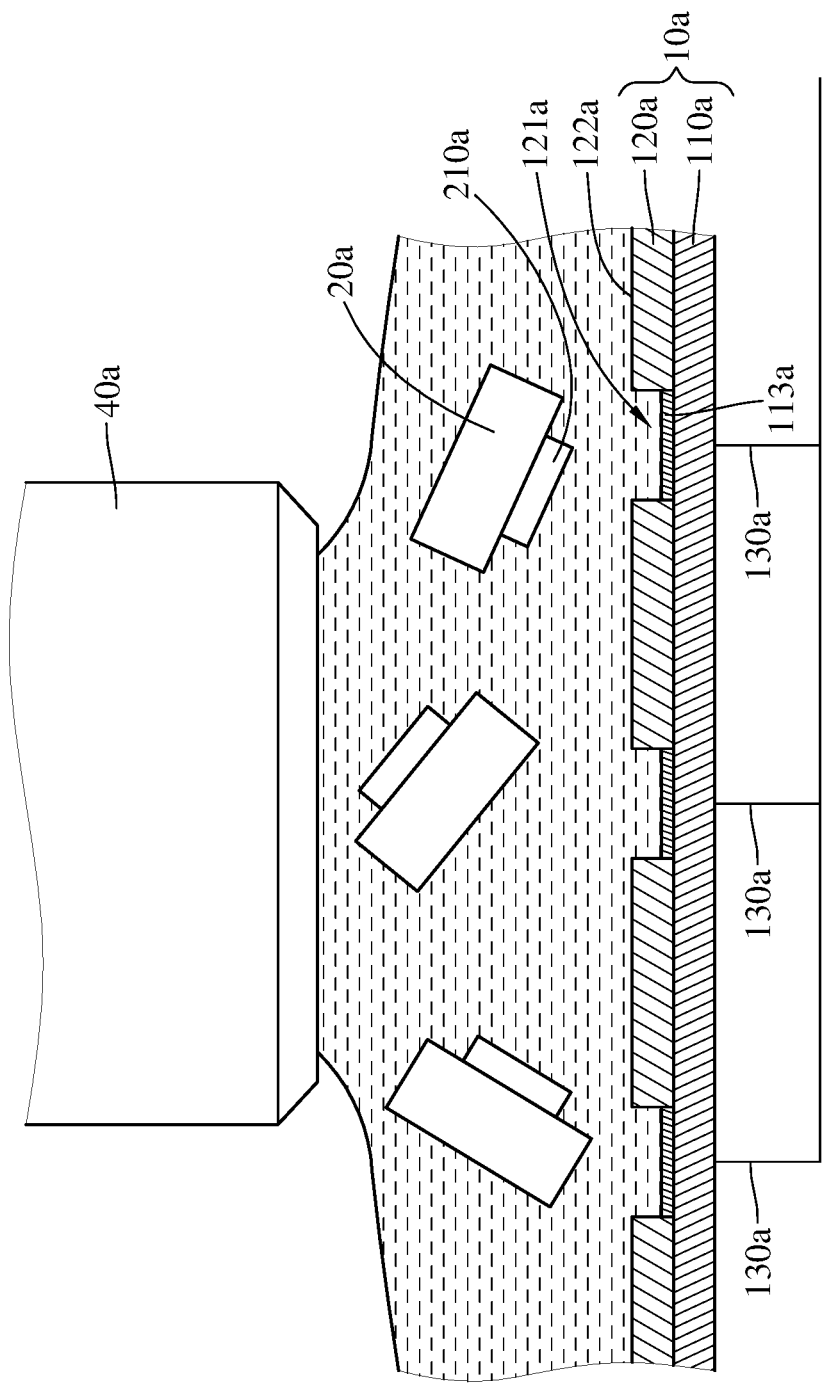

In the step S14, at least one droplet is provided on the mounting surface 122a of the insulation layer 120a, and the droplet contains the micro components 20a. As shown in FIG. 6, in this embodiment, one or more droplets are spread on the mounting surface 122a by a sprayer 40a, and each droplet contains multiple micro components 20a. a configuration of the electrode 210a of the micro component 20a corresponds to a configuration of the groove 121a. The droplets may be continuously spread along an extension direction of the substrate 10a or intermittently spread on several predetermined positions on the substrate 10a.

Figure 7:
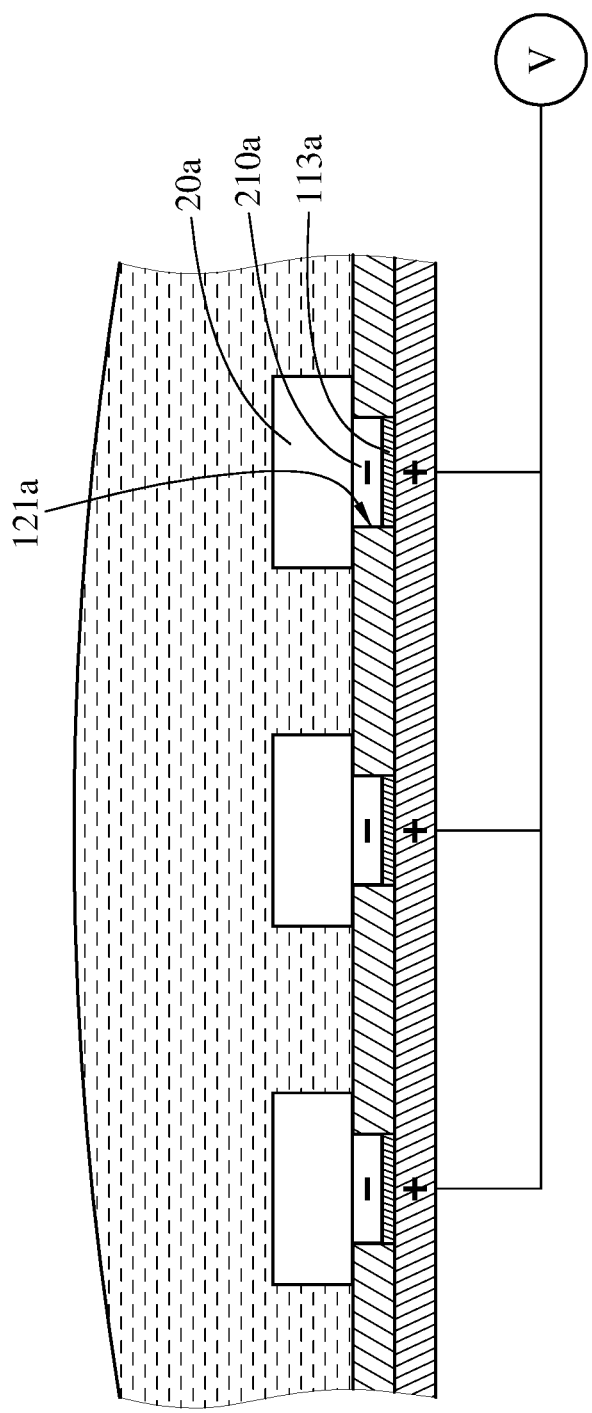

In the step S15, the electromagnetic force is provided, and a direction of the electromagnetic force is from the basal layer 110a toward the insulation layer 120a. As shown in FIG. 6 and FIG. 7, in this embodiment, the electromagnetic generator 130a includes multiple conductive wires electrically connected with respective metal contacts 113a. In the embodiment that the electromagnetic generator 130a includes multiple conductive wires. A voltage is applied on the metal contact 113a by respective conductive wire so as to generate an electrostatic force toward the groove 121a exposing the metal contact 113a. The electrostatic force is taken as the aforementioned electromagnetic force.

In this embodiment, a diameter of the droplet is larger than a maximum size of any one of the micro components 20a, and the diameter of the droplet is also larger than a sub-pixel region of the display device 1a. Therefore, a size of the droplet is suitable for containing at least one micro component 20a and transferring the micro component 20a to the sub-pixel region to obtain a sub-pixel unit. In some other embodiments without drawings, the diameter of the droplet is larger than the maximum size of any micro component, and the diameter of the droplet is smaller than or equal to the sub-pixel region of the display device. Thus, it is favorable for preventing the droplet from overflowing into the other regions outside of the sub-pixel region so as to maintain image quality.

In the step S16, the electrode 210a is attracted to the corresponding groove 121a by the electromagnetic force, such that the electrode 210a electrically contacts the metal contact 113a which the corresponding groove 121a exposes. As shown in FIG. 7, when the droplet is ejected from the sprayer 40a, the inner wall of the sprayer 40a rubs the electrodes 210a of the micro components 20a so as to build up static electricity on the electrodes 210a. The voltage is applied on the metal contact 113a by the electromagnetic generator 130a so as to generate the electrostatic force toward the groove 121a. The metal contact 113a is charged with electrostatic charges having opposite electrical polarity to the electrode 210a. For example, in a condition that negative charges are on the electrode 210a of the micro component 20a, the metal contact 113a is positively charged by the electromagnetic generator 130a so as to generate positive electrostatic force, such that the electrode 210a is attracted to the metal contact 113a, and thus the micro component 20a is successfully transferred to the substrate 10a. Since static electricity is existed on both the metal contact 113a and the electrode 210a, a directivity favorable for fitting the electrode 210a into the groove 121a is provided when the micro component 20a is transferred to the substrate 10a, thereby enhancing transfer efficiency.

After the step S16 is completed, the substrate 10a is heated to remove residual droplet on the micro component 20a or the substrate 10a. The electromagnetic generator 130a stops applying voltage on the metal contacts 113a so as to remove static electricity on the metal contacts 113a, and thus the display device of this embodiment is obtained.

Figure 8:
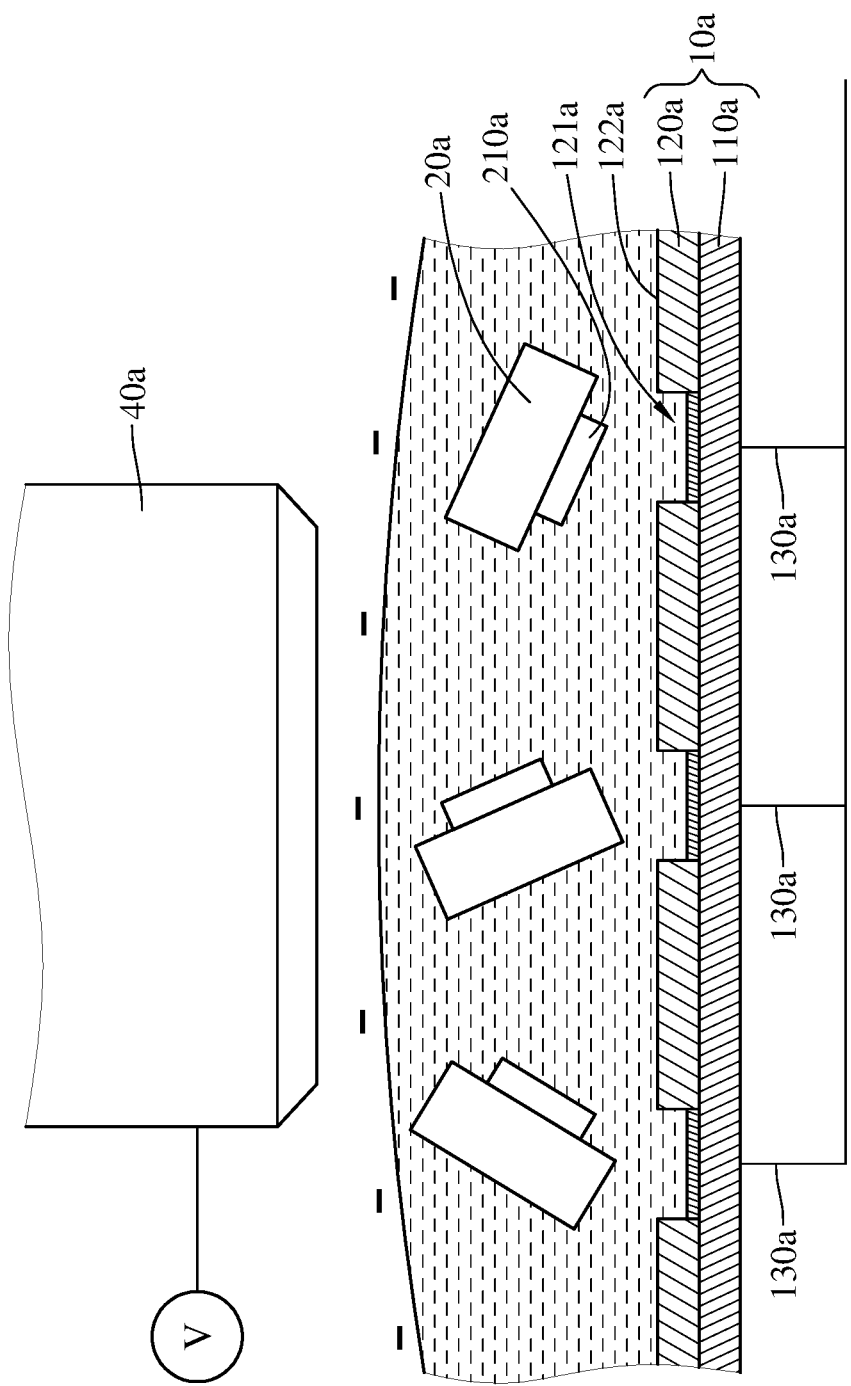
FIG. 8 and FIG. 9 are schematic views showing a method of manufacturing the display device in FIG. 2, according to a second embodiment of the present disclosure.
Figure 9:
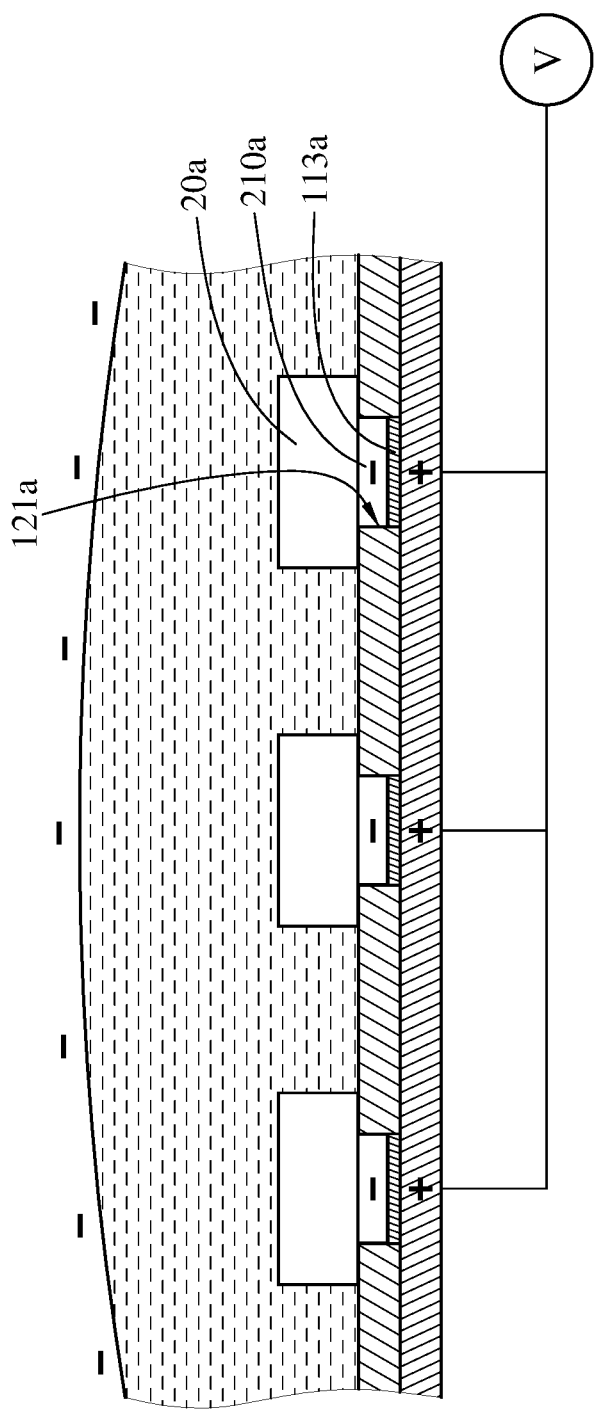

FIG. 8 and FIG. 9 are schematic views showing a method of manufacturing the display device in FIG. 2, according to a second embodiment of the present disclosure. The second embodiment is similar to the first embodiment, and the differences therebetween are described hereafter.

In this embodiment, when the droplet containing the micro components 20a is provided, the sprayer 40a is electrified so as to create static electricity on the droplet. For example, the sprayer 40a is electrified so as to create negative charges on each droplet. In such case, the droplet with negative charges can be electrically conductive. For example, the droplet may contain anisotropic conductive substances or nano metal particles.

When the electrode 210a is fitted into respective groove 121a by the electromagnetic force, the electromagnetic generator 130a applies voltage on the metal contact 113a so as to generate an electrostatic force toward the groove 121a exposing the metal contact 113a, and the electrostatic force is taken as the electromagnetic force. The metal contact 113a is charged to have opposite electrical polarity to the droplet. For example, in a condition that negative charges are on the droplet, the metal contact 113a is positively charged by the electrostatic force generated by the electromagnetic generator 130a, such that the droplet is attracted to the metal contact 113a, and thus the micro component 20a in the droplet is fitted into the groove 121a. Therefore, it is favorable for enhancing transfer efficiency of the micro component 20a to the substrate 10a.

Figure 10:
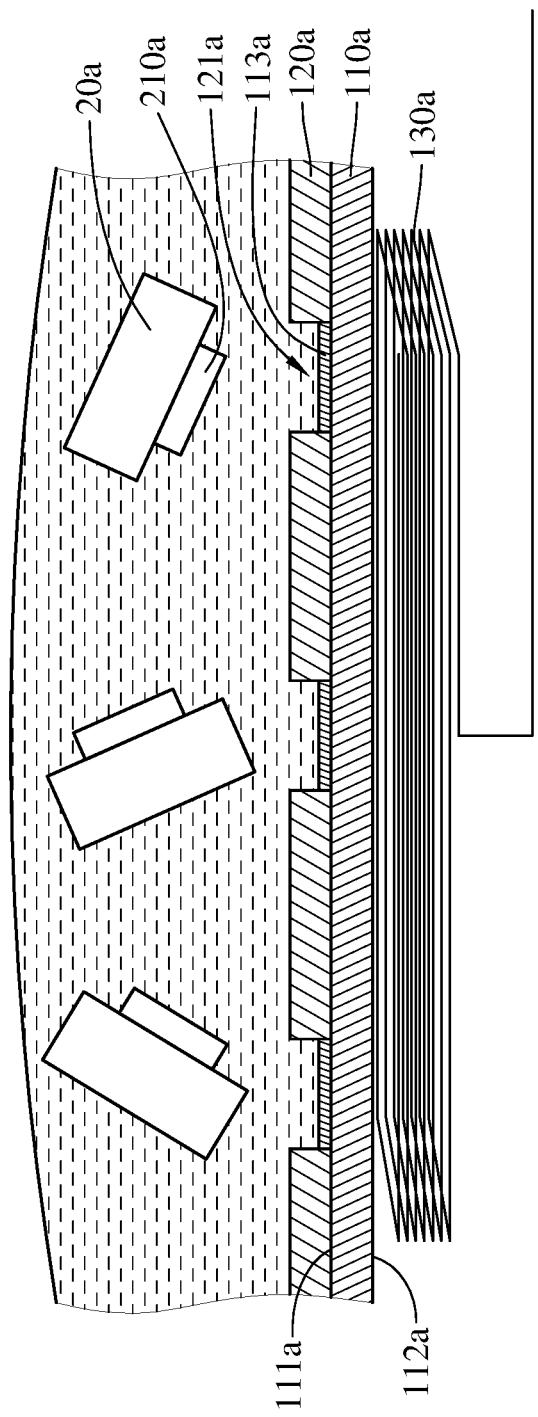
FIG. 10 and FIG. 11 are schematic views showing a method of manufacturing the display device in FIG. 2, according to a third embodiment of the present disclosure.
Figure 11:
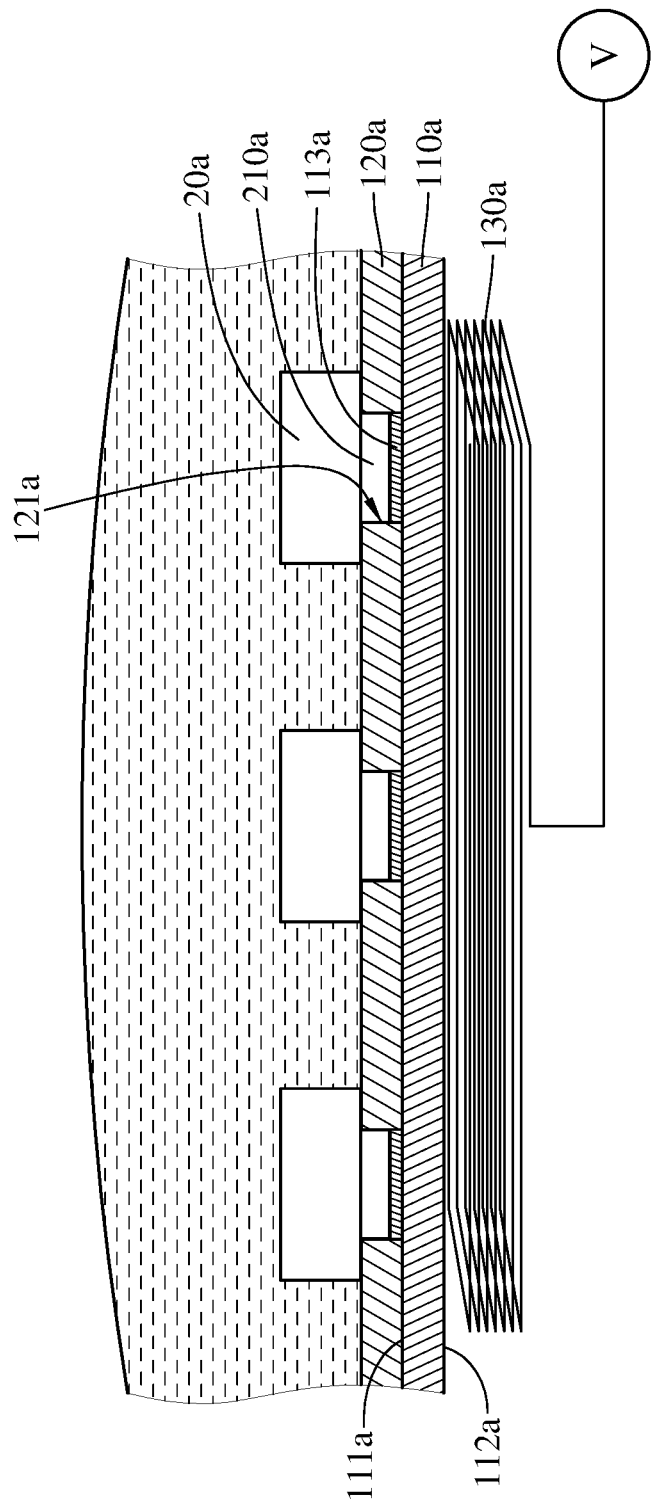

FIG. 10 and FIG. 11 are schematic views showing a method of manufacturing the display device in FIG. 2, according to a third embodiment of the present disclosure. The third embodiment is similar to the first embodiment, and the differences therebetween are described hereafter. In this embodiment, the display device includes an electromagnetic generator 130a which is a coil disposed on the mounting surface 112a (opposite to the top surface 111a) of the basal layer 110a of the substrate 10a, and the coil corresponds to the grooves 121a.

In this embodiment, both the metal contact 113a and the electrode 210a include a material with high permeability such as nickel and ferrous metal, but the present disclosure is not limited thereto. A voltage is applied on the coil so as to make the coil generate magnetic force, and a direction of the magnetic force is from the basal layer 110a toward the insulation layer 120a. The magnetic force is taken as an electromagnetic force. More specifically, when the coil is electrified, the metal contacts 113a are magnetized to have magnetic polarity due to electromagnetic induction. The electrode 210a of the micro component 20a moves close to the metal contact 113a by magnetic attraction therebetween so as to be fitted into the groove 121a.

Figure 12:
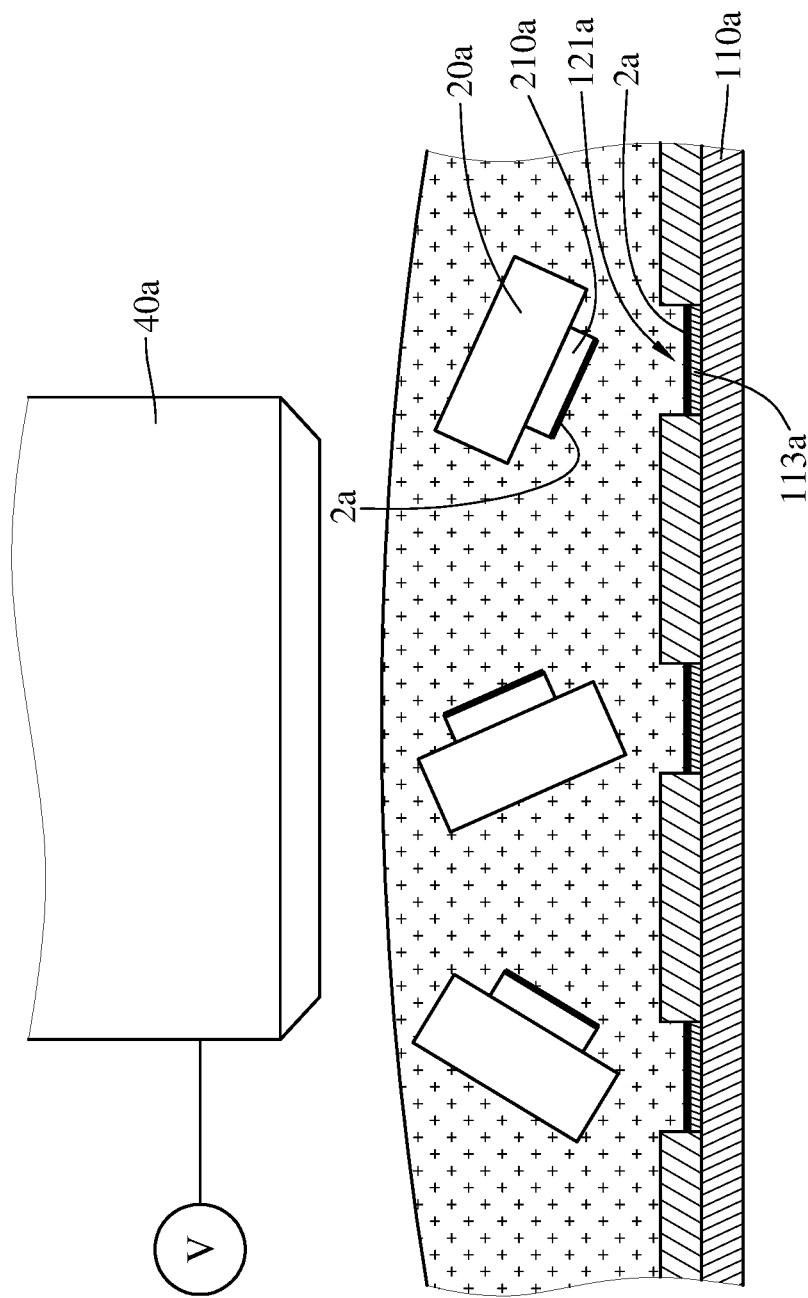
FIG. 12 and FIG. 13 are schematic views showing a method of manufacturing the display device in FIG. 2, according to a fourth embodiment of the present disclosure.
Figure 13:
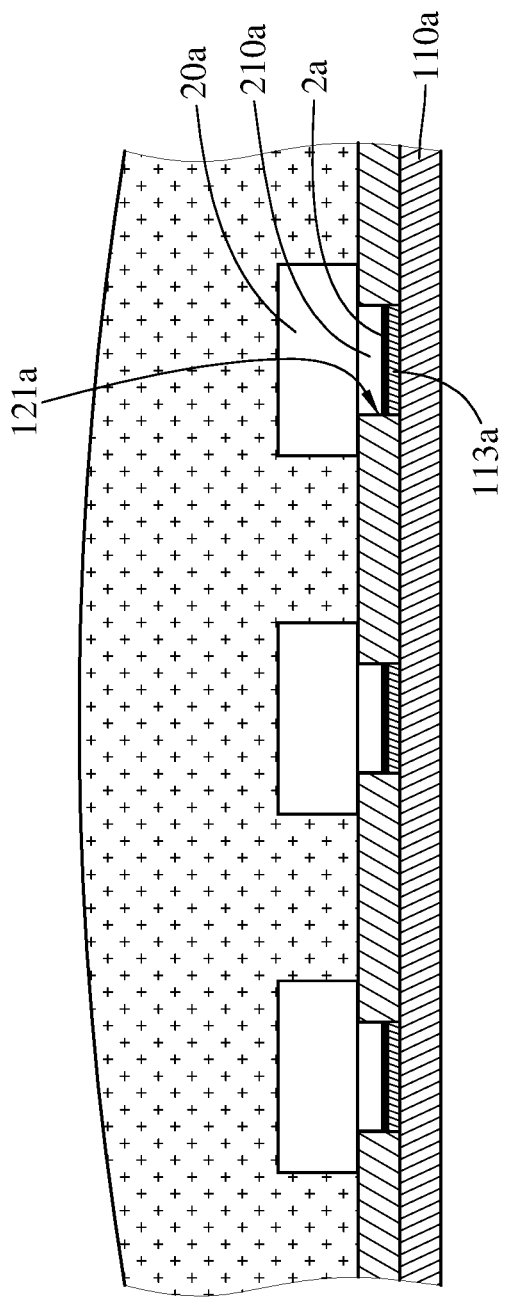

FIG. 12 and FIG. 13 are schematic views showing a method of manufacturing the display device in FIG. 2, according to a fourth embodiment of the present disclosure.

The fourth embodiment is similar to the first embodiment, and the differences therebetween are described hereafter. In this embodiment, the micro components 20a are contained in an electrically non-conductive droplet. The electrically non-conductive droplet is formed by electrically non-conductive liquid such as fluid resin.

Before the droplet containing the micro components 20a is provided, two conductive layers 2a are respectively disposed on the electrode 210a of each micro component 20a and each metal contact 113a of the basal layer 110a. The conductive layer 2a, for example, is a conductive plastic film. The electrically non-conductive droplet, containing the micro components 20a, is spread by the sprayer 40a. In such case, the conductive layers 2a are configured to contact each other for a better ohmic contact between the electrode 210a and the metal contact 113a. As shown in FIG. 13, the electrode 210a is fitted into the groove 121a, and the conductive layer 2a on the metal contact 113a electrically contacts the conductive layer 2a on the electrode 210a.

In this embodiment, two conductive layers 2a are respectively disposed on the electrode 210a and the metal contact 113a, but the present disclosure is not limited thereto. In some other embodiments, a conductive layer 2a is disposed on either the electrode 210a or the metal contact 113a.

Figure 14:
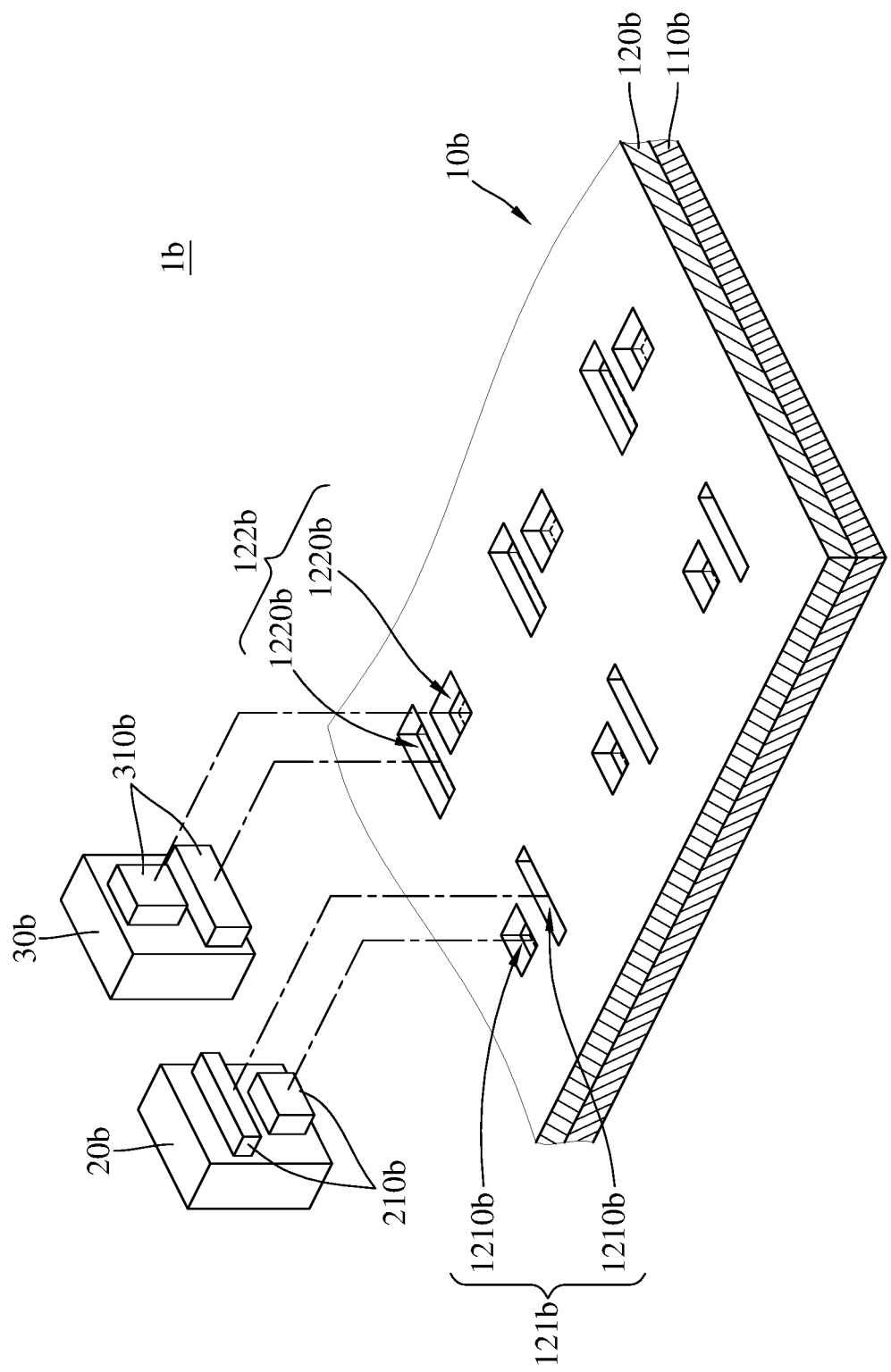
FIG. 14 is an exploded view of a display device according to another embodiment of the present disclosure.
Figure 15:
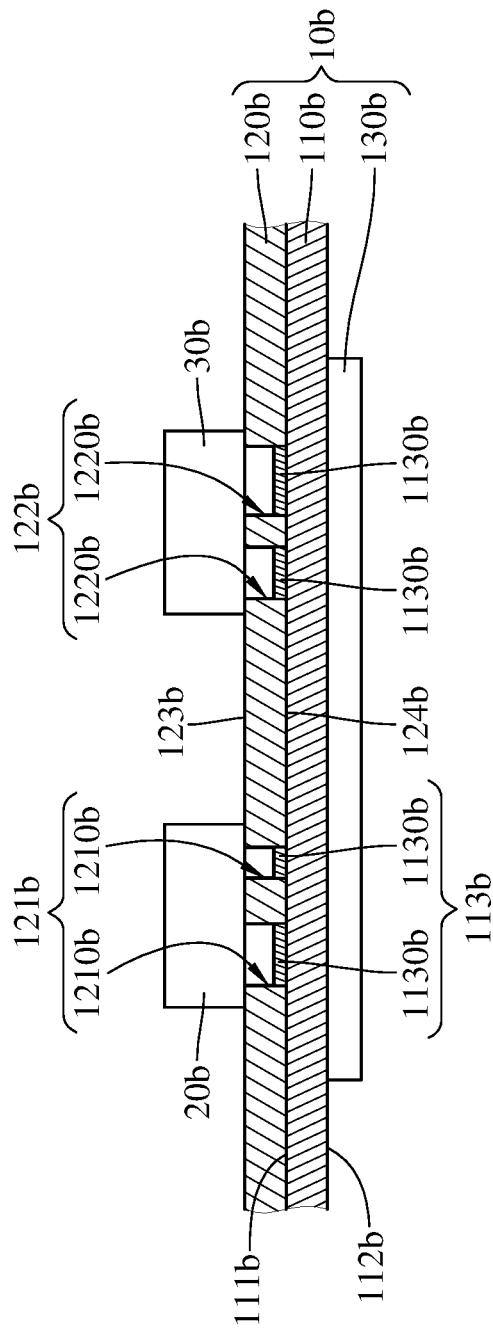
FIG. 15 is a cross-sectional view of the display device in FIG. 14.
Figure 16:
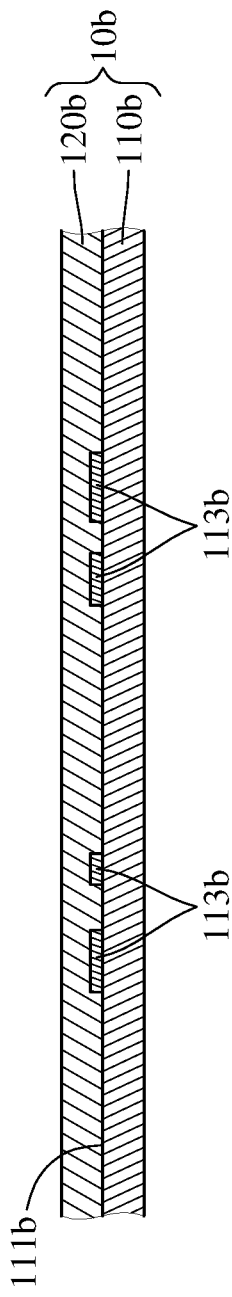
FIG. 16 through FIG. 19 are schematic views showing a method of manufacturing the display device in FIG. 15, according to a fifth embodiment of the present disclosure.
Figure 17:
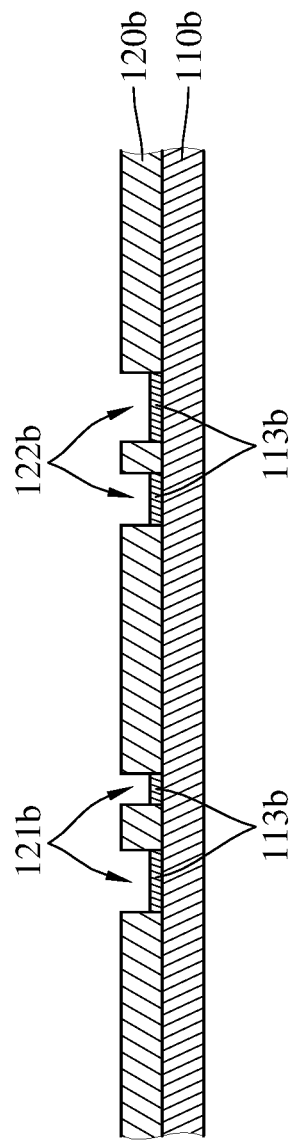

In FIG. 1, the basal layer 110a of the display device 1a includes multiple grooves 121a with each groove 121a having uniform configuration, and the substrate 10a of the display device 1a is provided with single specification for the transferring of the micro components 20a. It is worth noting that the present disclosure is not limited to that the grooves 121a should have uniform configuration. FIG. 14 is an exploded view of a display device according to another embodiment of the present disclosure. FIG. 15 is a cross-sectional view of the display device in FIG. 14. In this embodiment, a display device 1b includes a substrate 10b, a plurality of first micro components 20b and a plurality of second micro components 30b. It is worth noting that the present disclosure is not limited to the number of the first micro components 20b and that of the second micro components 30b.

The substrate 10b includes a basal layer 110b, an insulation layer 120b and an electromagnetic generator 130b. The basal layer 110b includes a top surface 111b, a mounting surface 112b and a plurality of metal contacts 113b. The metal contacts 113b are disposed on the top surface 111b, and the top surface 111b and the mounting surface 112b are opposite surfaces of the basal layer 110b. Each of the metal contacts 113b includes two sub contacts 1130b.

The insulation layer 120b, for example, is an electrically non-conductive polymer such as aluminum oxide (Al2O3), silicon dioxide (SiO2), aluminum nitride (AlN), silicon nitride and so on. The insulation layer 120a is disposed on the top surface 111b of the basal layer 110b. The insulation layer 120b includes a plurality of first groove 121b, a plurality of second grooves 122b, a mounting surface 123b and a bottom surface 124b. The mounting surface 123b is opposite to the bottom surface 124b. The mounting surface 123b is opposite to the basal layer 110b, and the bottom surface 124b faces the basal layer 110b. Both the first groove 121b and the second groove 122b extend from the mounting surface 123b to the bottom surface 124b so as to penetrate through the insulation layer 120b. The first grooves 121b respectively correspond to some of the metal contacts 113b on the basal layer 110b, and the first grooves 121b expose respective metal contacts 113b. The second grooves 122b respectively correspond to the other metal contacts 113b, and the second grooves 122b expose respective metal contacts 113b.

Each of the first grooves 121b includes two sub grooves 1210b. As to one of the first grooves 121b and one of the metal contacts 113b corresponding to each other, the two sub grooves 1210b respectively expose the two sub contacts 1130b. Moreover, each of the second grooves 122b includes two sub grooves 1220b. As to one of the second grooves 122b and one of the metal contacts 113b corresponding to each other, the two sub grooves 1220b respectively expose the two sub contacts 1130b.

The configuration of the second groove 122b is different from the configuration of the first groove 121b. In detail, the first groove 121b has different size or different pattern from the second groove 122b. In this embodiment, the two sub grooves 1210b of the first groove 121b are a rectangular hole and a slit hole, respectively, and the two sub grooves 1220b of the second groove 122b are a square hole and a rectangular hole, respectively.

The electromagnetic generator 130b is disposed on the mounting surface 112b of the basal layer 110b, and the electromagnetic generator 130b corresponds to the first grooves 121b and the second grooves 122b in order to provide electromagnetic force along a direction from the basal layer 110b toward the insulation layer 120b. In one embodiment, the electromagnetic generator 130b includes multiple conductive wires electrically connected with respective metal contacts 113b. In another embodiment, the electromagnetic generator 130b is a single coil spaced apart from the metal contacts 113b. In still another embodiment, the electromagnetic generator 130b includes a plurality of coils, and the coils respectively correspond to the metal contacts 113b.

Each of the first micro components 20b, for example, is a red LED including an electrode 210b. The configuration of the electrode 210b of the first micro component 20b corresponds to the configuration of the first groove 121b, and the electrode 210b of each of the first micro components 20b is fitted into one of the first grooves 121b. The electrode 210b electrically contacts the metal contact 113b which the corresponding first groove 121b exposes.

Each of the second micro components 30b, for example, is a green LED including an electrode 310b. The configuration of the electrode 310b of the second micro component 30b corresponds to the configuration of the second groove 122b, and the electrode 310b of each of the second micro components 30b is fitted into one of the second grooves 122b. The electrode 310b electrically contacts the metal contact 113b which the corresponding second groove 122b exposes.

FIG. 16 through FIG. 19 are schematic views showing a method of manufacturing the display device in FIG. 15, according to a fifth embodiment of the present disclosure. At first, the basal layer 110b including the metal contacts 113b is provided. The insulation layer 120b is disposed on the top surface 111b of the basal layer 110b. The basal layer 110b and the insulation layer 120b jointly form the substrate 10b of the display device.

The first grooves 121b and the second grooves 122b are formed on the insulation layer 120b. The first grooves 121b correspond to and expose respective metal contacts 113b of the basal layer 110b. The second grooves 122b correspond to and expose respective metal contacts 113b of the basal layer 110b. In this embodiment, a photolithography process and an etching process may be performed to remove part of the insulation layer 120b, thereby forming the grooves.

At least one droplet is provided on the mounting surface 123b of the insulation layer 120b, and the droplet contains the first micro components 20b and the second micro components 30b. Multiple droplets may be continuously spread along an extension direction of the substrate 10b or intermittently spread on several predetermined positions on the substrate 10b.

Figure 18:
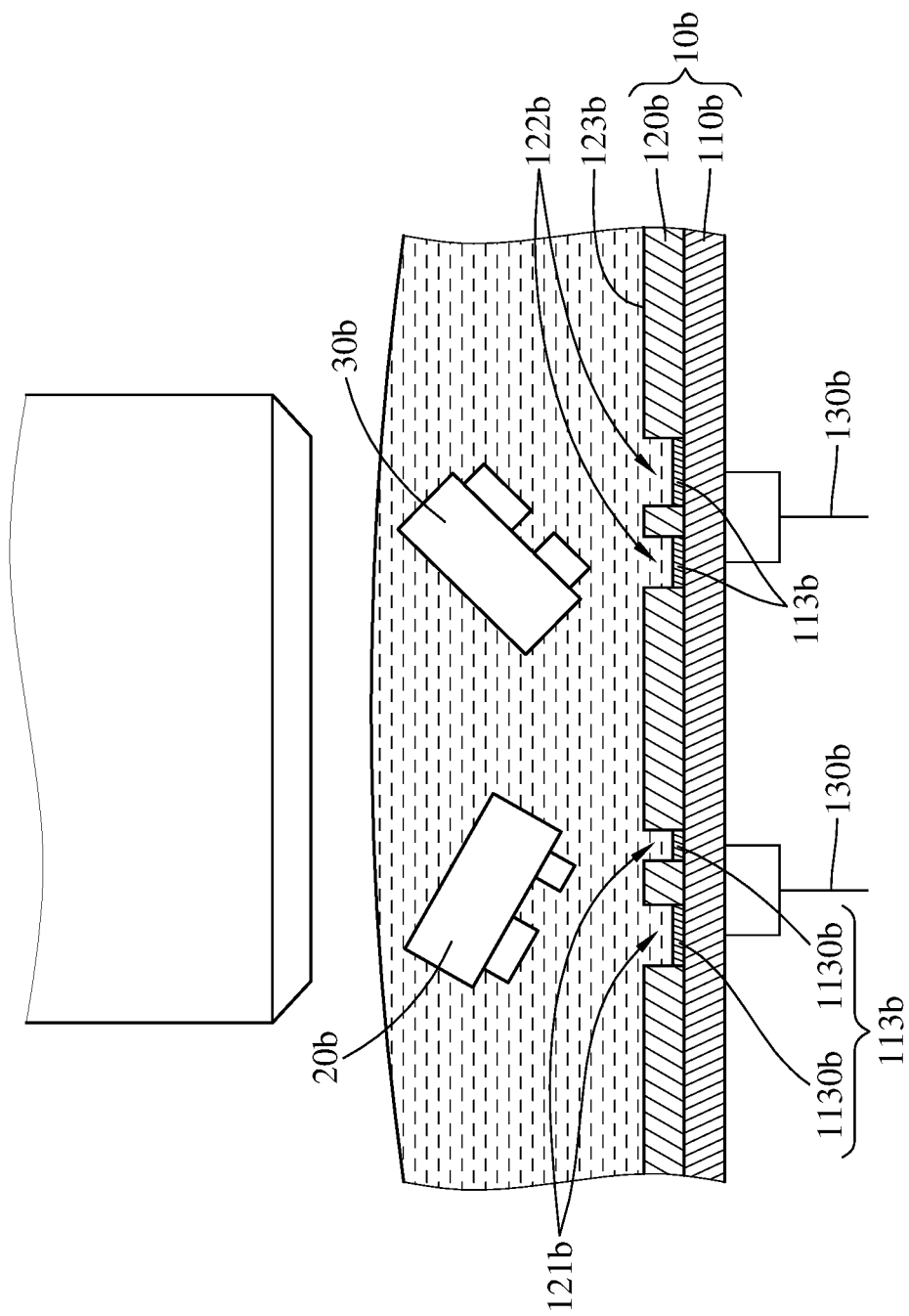
Figure 19:
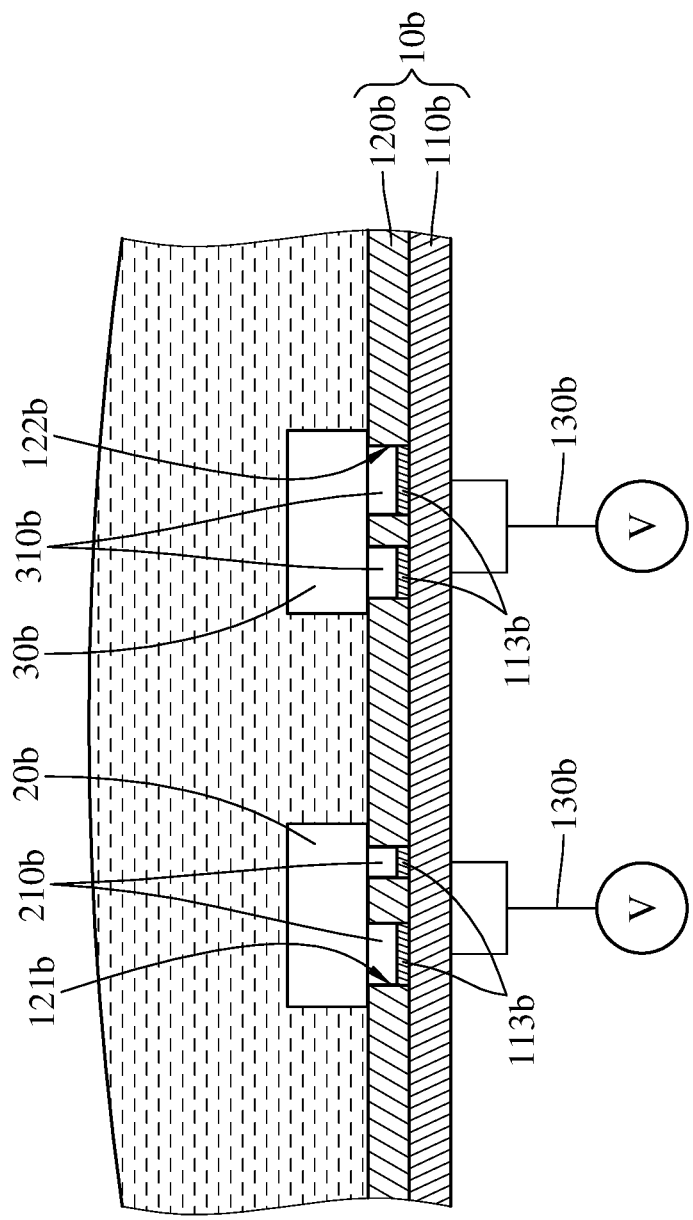

The electromagnetic force is provided, and a direction of the electromagnetic force is from the basal layer 110b toward the insulation layer 120b. As shown in FIG. 18 and FIG. 19, in this embodiment, the electromagnetic generator 130b includes multiple conductive wires respectively and electrically connected with the sub contacts 1130b of the metal contacts 113b. In the embodiment that the electromagnetic generator 130b includes multiple conductive wires, a voltage is applied on the sub contacts 1130b by respective conductive wires, so as to generate a first electrostatic force toward the first groove 121b exposing the metal contact 113b; furthermore, a voltage is applied on the sub contacts 1130b by respective conductive wires, so as to generate a second electrostatic force toward the second groove 122b exposing the metal contact 113b. The first electrostatic force and the second electrostatic force are taken as the electromagnetic force. The electromagnetic generator 130b can simultaneously apply voltage on every metal contact 113b to generate the electrostatic force; or, the electromagnetic generator 130b can apply voltage on some metal contacts 113b, which the first grooves 121b expose, and the other metal contacts 113b, which the second grooves 122b expose, at different times. The metal contact 113b which the first groove 121b exposes can be charged to have opposite electrical polarity to the metal contact 113b which the second groove 122b exposes; or, the metal contacts 113b can have the same electrical polarity but different electrical strength.

The electrode 210b of the first micro component 20b is fitted into respective first groove 121b by the electromagnetic force, such that the electrode 210b electrically contacts the metal contact 113b which the first groove 121b exposes. As shown in FIG. 19, the electrode 210b is influenced by the electric field generated by the first electrostatic force so as to be charged with opposite electrical polarity to the first electrostatic force. Due to the interaction of the electrostatic force, the electrode 210b is attracted to the metal contact 113b which the first groove 121b exposes, such that the electrode 210b is fitted into the first groove 121b, thereby transferring the first micro component 20b to the substrate 10b. Since the first groove 121b has different configuration from the second groove 122b, the first micro component 20b is prevented from being fitted into the second groove 122b.

Furthermore, the electrode 310b of the second micro component 30b is fitted into respective second groove 122b by the electromagnetic force, such that the electrode 310b electrically contacts the metal contact 113b which the second groove 122b exposes. the electrode 310b is influenced by the electric field generated by the second electrostatic force so as to be charged with opposite electrical polarity to the second electrostatic force. Due to the interaction of electrostatic force, the electrode 310b is attracted to the metal contact 113b which the second groove 122b exposes, such that the electrode 310b is fitted into the second groove 122b, thereby transferring the second micro component 30b to the substrate 10b. Since the second groove 122b has different configuration from the first groove 121b, the second micro component 30b is prevented from accidentally fitted into the first groove 121b.

In this embodiment, as to each metal contact 113b which the first groove 121b exposes, the first electrostatic force is a positive electrostatic force arising from electric charges on the two sub contacts 1130b of the metal contact 113b. As to each metal contact 113b which the second groove 122b exposes, the second electrostatic force is a negative electrostatic force arising from electric charges on the two sub contacts 1130b of the metal contact 113b. It is worth noting that the present disclosure is not limited to the aforementioned electrical polarity.

Finally, the substrate 10b is heated to remove residual droplet on the first micro component 20b, the second micro component 30b or the substrate 10b, thereby obtaining the display device in FIG. 15.

Figure 20:
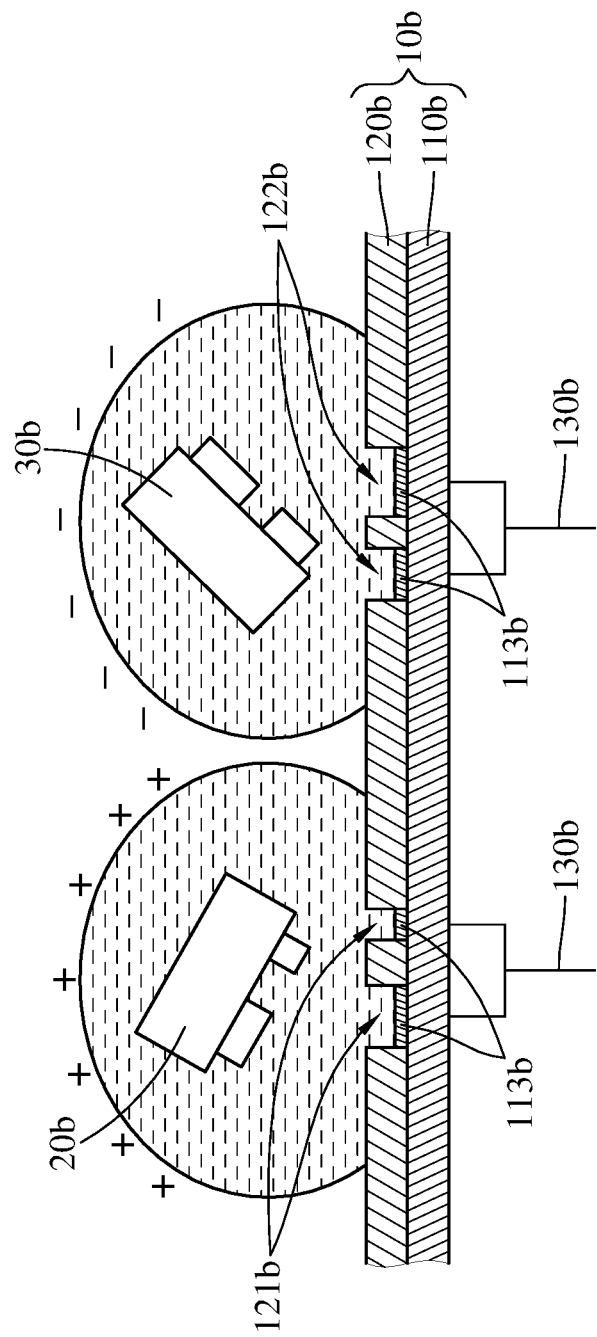
FIG. 20 and FIG. 21 are schematic views showing a method of manufacturing the display device in FIG. 15, according to a sixth embodiment of the present disclosure.
Figure 21:
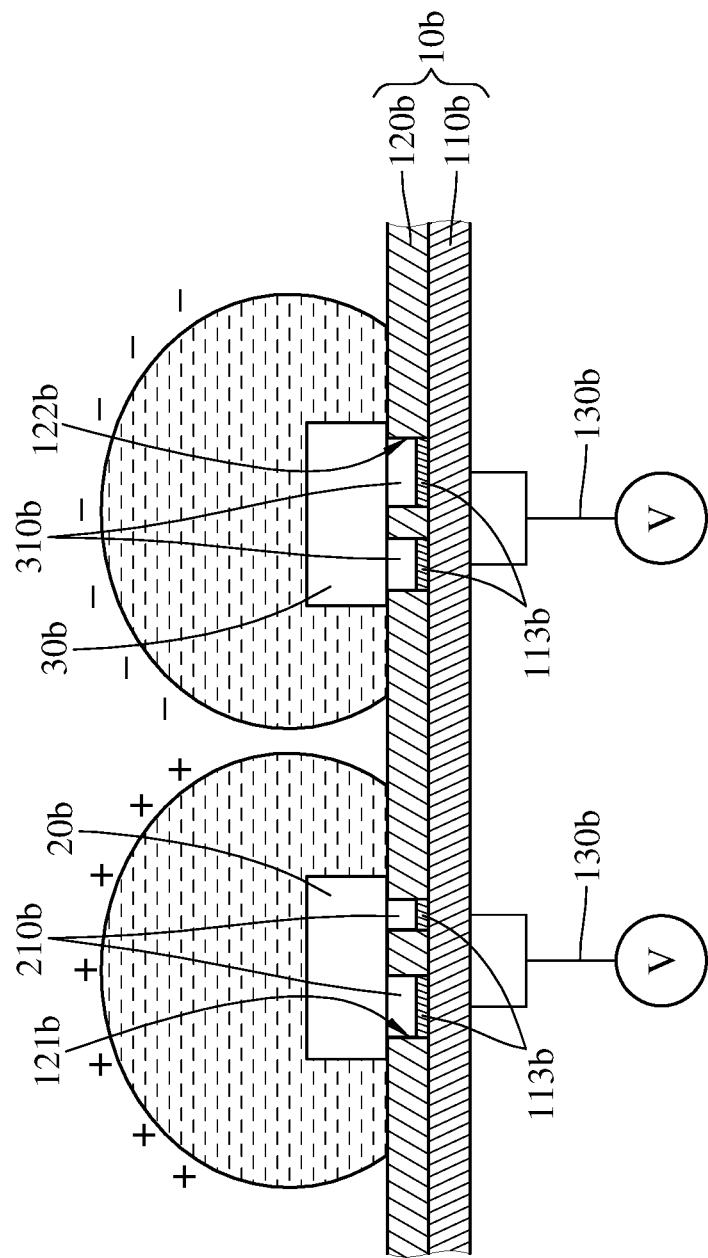

FIG. 20 and FIG. 21 are schematic views showing a method of manufacturing the display device in FIG. 15, according to a sixth embodiment of the present disclosure. The sixth embodiment is similar to the fifth embodiment, and the differences therebetween are described hereafter. In this embodiment, when the droplets containing the first micro components 20b and the second micro components 30b are provided, a sprayer is electrified so as to create static electricity on the droplets. In detail, the sprayer creates positive charges on a first droplet containing the first micro components 20b. Then, the sprayer creates negative charges on a second droplet containing the second micro components 30b.

When the electrode 210b is fitted into respective first groove 121b by using the electromagnetic force, the electromagnetic generator 130b applies voltage on the metal contact 113b so as to generate an electrostatic force toward the first groove 121b exposing the metal contact 113b, and the electrostatic force is taken as the electromagnetic force. The metal contact 113b which the first groove 121b exposes is charged to have opposite electrical polarity to the first droplet. in a condition that positive charges are on the first droplet, the metal contact 113b which the first groove 121b exposes is negatively charged by the electromagnetic generator 130b so as to generate negative electrostatic force. At this moment, since negative charges are on the second droplet, the second droplet repels the metal contact 113b which the first groove 121b exposes. Therefore, the second micro components 30b are prevented from being overly close to the first grooves 121b, and thus an interference in the transferring of the first micro components 20b to the substrate 10b is prevented.

Similarly, when the electrode 310b is fitted into respective second groove 122b by the electromagnetic force, the electromagnetic generator 130b applies voltage on the metal contact 113b so as to generate an electrostatic force toward the second groove 122b exposing the metal contact 113b, and the electrostatic force is taken as the electromagnetic force. The metal contact 113b which the second groove 122b exposes is charged to have opposite electrical polarity to the second droplet. in a condition that negative charges are on the second droplet, the metal contact 113b which the second groove 122b exposes is positively charged by the electromagnetic generator 130b so as to generate positive electrostatic force. Since positive charges are on the first droplet, the first droplet repels the metal contact 113b which the second groove 122b exposes. Therefore, the first micro components 20b are prevented from being overly close to the second grooves 122b, and thus an interference in the transferring of the second micro components 30b to the substrate 10b is prevented.

Figure 22:
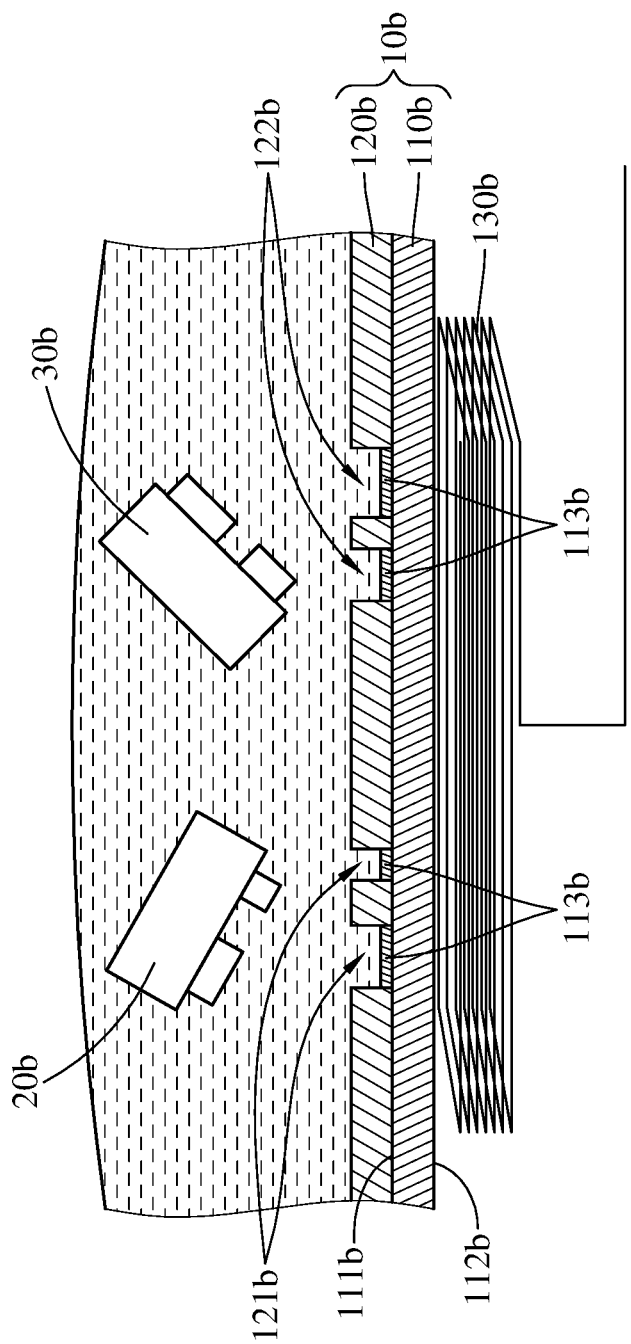
FIG. 22 and FIG. 23 are schematic views showing a method of manufacturing the display device in FIG. 15, according to a seventh embodiment of the present disclosure.
Figure 23:
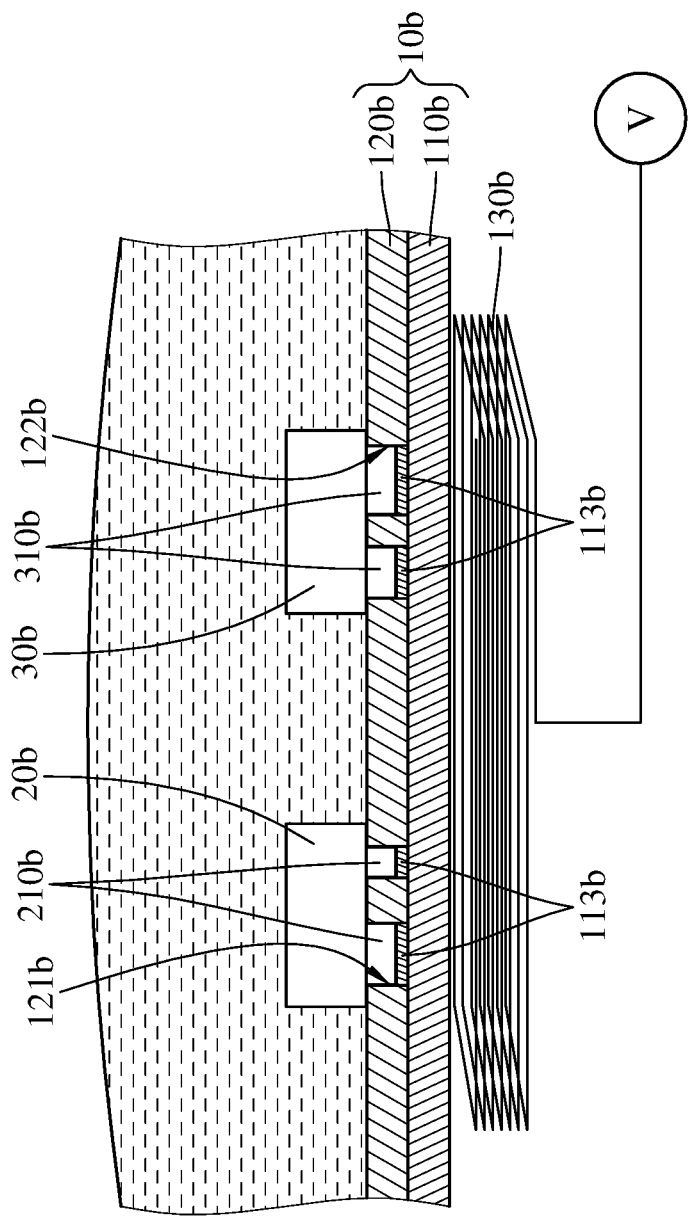

FIG. 22 and FIG. 23 are schematic views showing a method of manufacturing the display device in FIG. 15, according to a seventh embodiment of the present disclosure. The seventh embodiment is similar to the fifth embodiment, and the differences therebetween are described hereafter. In this embodiment, the electromagnetic generator 130*b* is a coil disposed on the mounting surface 112*b* (opposite to the top surface 111*b*) of the basal layer 110*b* of the substrate 10*b*, and the coil corresponds to the first grooves 121*b* and the second grooves 122*b*.

A voltage is applied on the coil so as to make the coil generate magnetic force, and a direction of the magnetic force is from the basal layer 110*b* toward the insulation layer 120*b*. The magnetic force is taken as an electromagnetic force. The electrode 210*b*, the electrode 310*b* and the metal contact 113*b* include a material with high permeability such as nickel, and ferrous metal. In detail, when the coil is electrified, the metal contacts 113*b* are magnetized to have magnetic polarity due to electromagnetic induction. The electrode 210*b* or 310*b* moves close to the metal contact 113*b* by magnetic attraction therebetween so as to be fitted into the first groove 121*b* or the second groove 122*b*.

Figure 24:
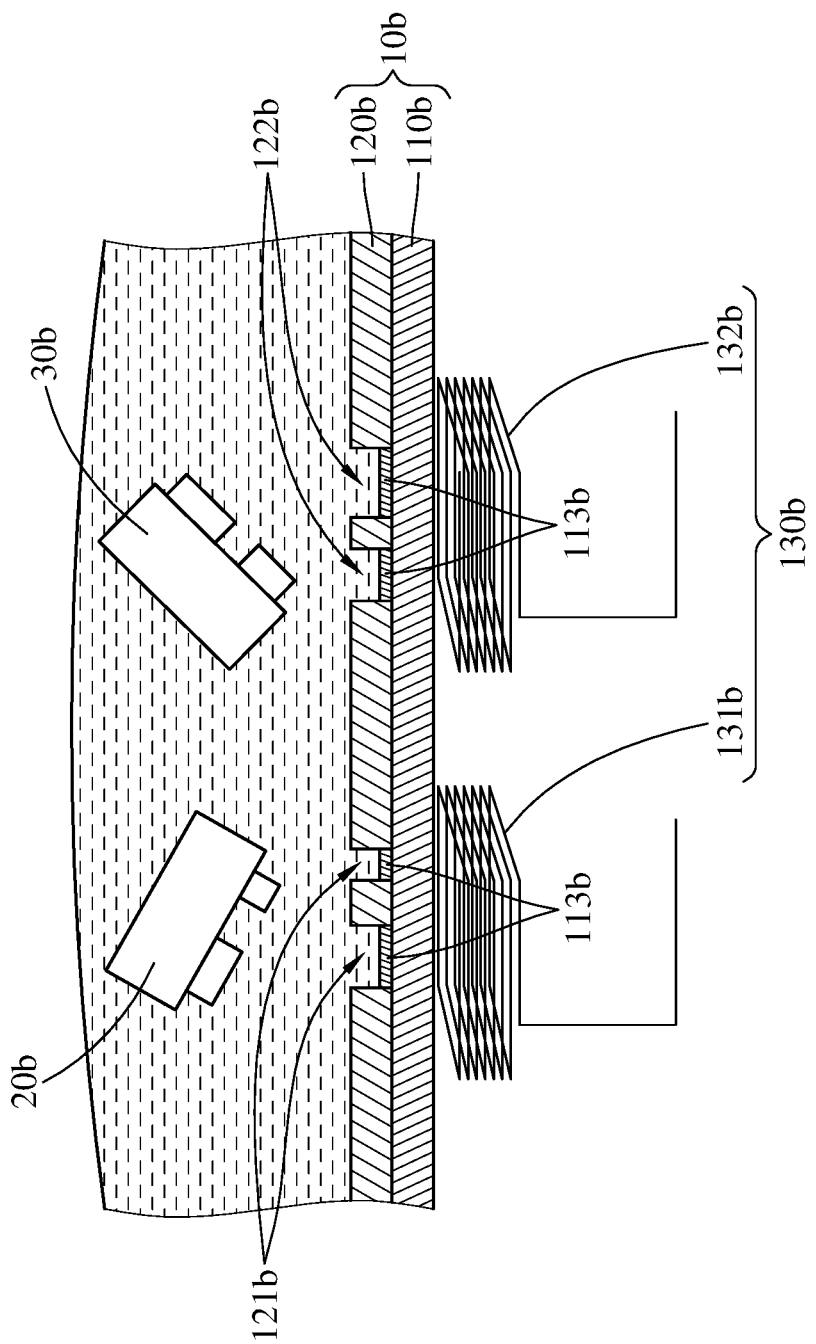
FIG. 24 and FIG. 25 are schematic views showing a method of manufacturing the display device in FIG. 15, according to an eighth embodiment of the present disclosure.
Figure 25:
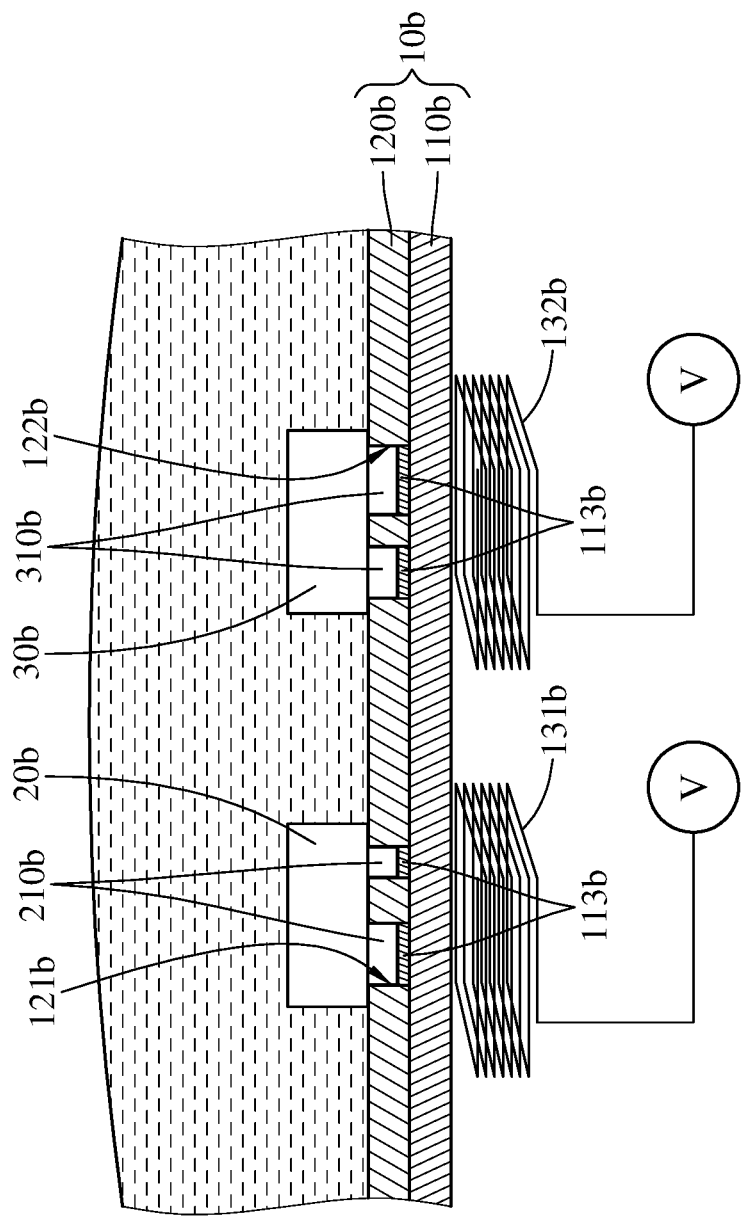

FIG. 24 and FIG. 25 are schematic views showing a method of manufacturing the display device in FIG. 15, according to an eighth embodiment of the present disclosure. The eighth embodiment is similar to the fifth embodiment, and the differences therebetween are described hereafter. In this embodiment, the electromagnetic generator 130*b* includes a plurality of first coils 131*b* and a plurality of second coils 132*b*. The first coils 131*b* and the second coils 132*b* are disposed on the mounting surface 112*b* of the basal layer 110*b* of the substrate 10*b*. The first coils 131*b* correspond to with the first grooves 121*b*, and the second coils 132*b* respectively correspond to the second grooves 122*b*.

Each of the first coils 131*b* is configured to generate a first magnetic force by voltage applied thereon. In detail, when the electromagnetic force is provided along the direction from the basal layer 110*b* toward the insulation layer 120*b*, the first coils 131*b* are electrified so as to provide the first magnetic force toward respectively first grooves 121*b*, such that the metal contacts 113*b*, which the first grooves 121*b* expose, are magnetized to have magnetic polarity. Similarly, each of the second coils 132*b* is configured to generate a second magnetic force by voltage applied thereon. In detail, when the electromagnetic force is provided along the direction from the basal layer 110*b* toward the insulation layer 120*b*, the second coils 132*b* are electrified so as to provide the second magnetic force toward respectively second grooves 122*b*, such that the metal contacts 113*b*, which the second grooves 122*b* expose, are magnetized to have magnetic polarity.

The first magnetic force can have opposite magnetic polarity to the second magnetic force. For example, the first magnetic force can be a north (N) pole magnetic force, and the second magnetic force can be a south (S) pole magnetic force. Moreover, the voltage can be simultaneously applied on the first coils 131*b* and the second coils 132*b*, such that every metal contact 113*b* is magnetized at the same time. Or, the voltage is firstly applied on the first coils 131*b* so as to magnetize some metal contacts 113*b*, and the voltage is applied on the second coils 132*b* after stopping applying voltage on the first coils 131*b* so as to magnetize the other metal contacts 113*b*.

The electrode 210*b* is attracted to the metal contact 113*b* by the magnetic attraction therebetween, such that the electrode 210*b* is fitted into respective first groove 121*b*. In this embodiment, by turning off the second coils 132*b*, the metal contacts 113*b*, which the first grooves 121*b* expose, are magnetized while the other metal contacts 113*b* are not magnetized. Thus, the first micro component 20*b* is closer to the first groove 121*b* than the second groove 122*b*, such that it is favorable for preventing a fail in the transferring of the first micro components 20*b* caused by overly close distance between the electrode 210*b* and the second groove 122*b*.

The electrode 310*b* is attracted to the metal contact 113*b* by the magnetic attraction therebetween, such that the electrode 310*b* is fitted into respective second groove 122*b*. In this embodiment, by turning off the first coils 131*b*, the metal contacts 113*b*, which the second grooves 122*b* expose, are magnetized while the other metal contacts 113*b* are not magnetized. Thus, the second micro component 30*b* is closer to the second groove 122*b* than the first groove 121*b*, such that it is favorable for preventing a fail in the transferring of the second micro components 30*b* caused by overly close distance between the electrode 310*b* and the first groove 121*b*.

Figure 26:
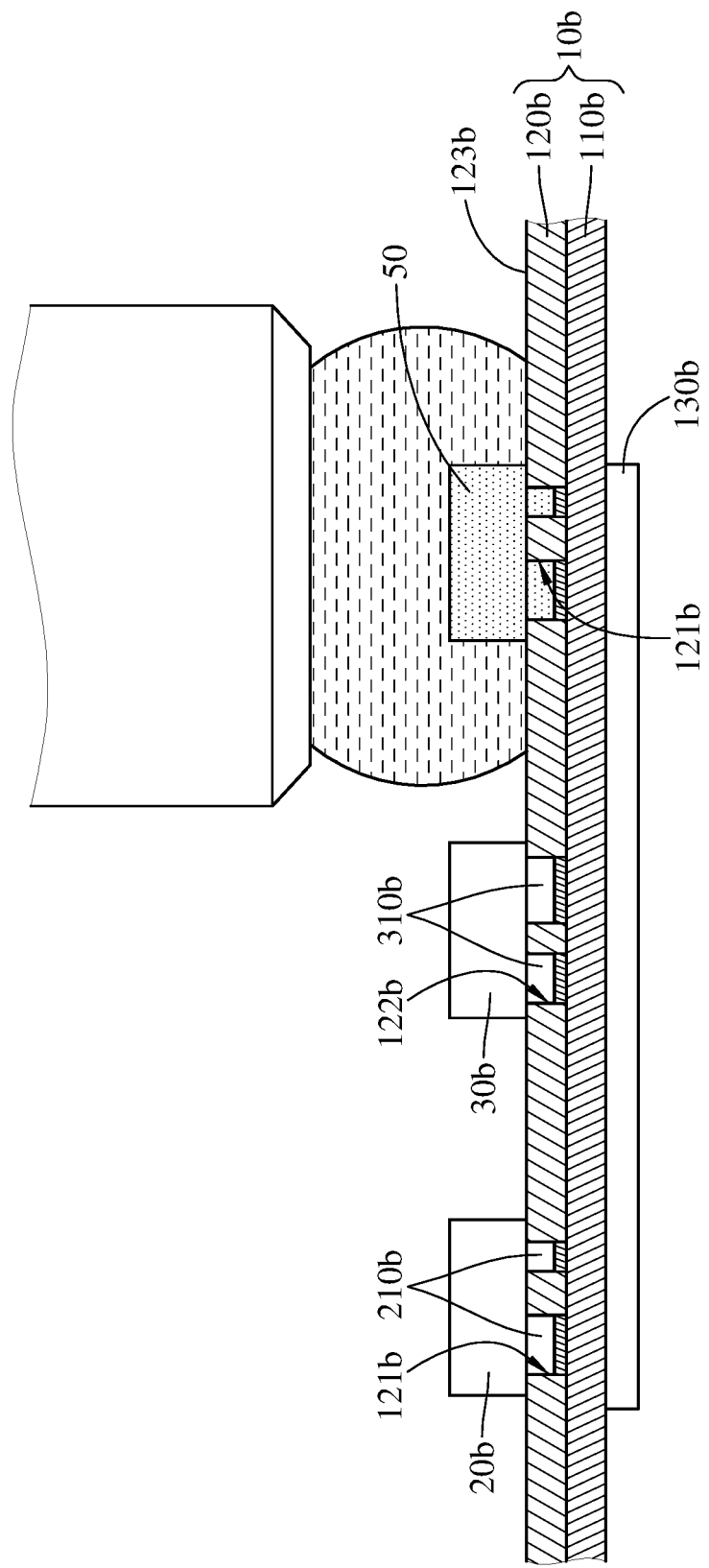
FIG. 26 is a schematic view showing removal of abnormal micro component according to one embodiment of the present disclosure.

Referring to FIG. 14, during the manufacturing of the display device 1*b*, since first micro component 20*b* or the second micro component 30*b* may be a defective component, the micro component is probably not fitted into predetermined groove. For example, suppose the electrode 310*b* of one second micro component 30*b* has abnormal configuration, the electrode 310*b* may be accidentally fitted into the first groove 121*b* when a step is performed to fit the electrode 310*b* into the second groove 122*b*, and thus this second micro component 30*b* is in a wrong position. To solve this problem, the present disclosure provides a method of removing abnormal micro components after some micro components have been transferred to the substrate. FIG. 26 is a schematic view showing removal of abnormal micro component according to one embodiment of the present disclosure, wherein one or more abnormal micro components 50 are fitted into the first grooves 121*b*.

After the electrodes 210*b* of the first micro components 20*b* are fitted into respective first grooves 121*b* and the electrodes 310*b* of the second micro components 30*b* are fitted into respective second grooves 122*b*, the micro components are inspected by an instrument, such as an optical inspection system or an electrical measurement tool, to check whether the micro components, which is fitted into respective grooves, function normally. In FIG. 26, when the micro components fitted into the first grooves 121*b* are inspected, an abnormal micro component 50 is discovered in one of the first grooves 121*b*. In this embodiment, the abnormal micro component 50 can be a micro component emitting emit light of different color from the first micro component 20*b*, or the abnormal micro component 50 can be a first micro component with low light intensity.

When a condition that one or more abnormal micro components are fitted into the grooves is discovered, the electromagnetic generator stops providing electromagnetic force toward these grooves. In FIG. 26, electromagnetic generator 130*b* stops providing electromagnetic force toward the first groove 121*b* where the abnormal micro component 50 is fitted.

After the abnormal micro component 50 is discovered, the abnormal micro component 50 is removed from the mounting surface 123*b* of the substrate 10*b*. In this embodiment, another droplet without any micro component is provided on the mounting surface 123*b*. This another droplet and the droplet containing the micro components can be formed by different liquids.

The another droplet is sucked by a suction pump (not shown in the drawings). Due to the surface tension between the another droplet and the mounting surface 123*b*, the another droplet is removed so as to bring the abnormal micro component 50 fitted into the first groove 121*b* to be removed from the mounting surface 123*b*. The abnormal micro component 50 is removed by a liquid droplet in this embodiment, but the present disclosure is not limited thereto. In some other embodiments, the abnormal micro component 50 is removed from the mounting surface 123*b* by using a viscous substance to stick the abnormal micro component 50.

According to the present disclosure, the display device includes a substrate, and the substrate includes an insulation layer which multiple grooves are formed thereon. The grooves respectively correspond to multiple metal contacts, and each groove exposes respective metal contact. Moreover, In the method of manufacturing the display device, a droplet containing multiple micro components is provided on the mounting surface of the insulation layer, and the electrode of each of the micro components is attracted to the corresponding groove by the electromagnetic force toward this groove. The electrode is fitted into the corresponding groove so as to electrically contact the metal contact which this groove exposes. Therefore, it is favorable simply and rapidly transferring the micro components to the substrate. The electromagnetic force is favorable for fitting the electrode into correct groove so as to enhance transfer efficiency.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A method of manufacturing display device, comprising:
providing a substrate comprising a basal layer and a plurality of eta contacts located on a top surface of the basal layer;
disposing an insulation layer on the top surface of the basal layer, wherein the insulation layer comprises a first mounting surface and a bottom surface, the first mounting surface is opposite to the basal layer, and the bottom surface faces the basal layer;
forming a plurality of grooves on the insulation layer, wherein each of the grooves extends from the first mounting surface to the bottom surface, the grooves respectively correspond to the metal contacts, and the grooves expose respective metal contacts;
providing at least one electromagnetic force, comprising applying voltage on at least one of the metal contacts so as to generate electrostatic force, which is toward at least one of the groove exposing the metal contact, as the at least one electromagnetic force, wherein a direction of the at least one electromagnetic force is from the basal layer toward the insulation layer, and the electrode of each of the micro components has opposite electrical polarity to electrostatic force;
providing a droplet on the first mounting surface, wherein the droplet contains a plurality of micro components, each of the micro components includes an electrode, and a configuration of the electrode corresponds to a configuration of one of the grooves; and
attracting the electrode to the corresponding groove by the at least one electromagnetic force, such that the electrode electrically contacts the metal contact which the corresponding groove exposes.

2. The method according to claim 1, wherein the grooves comprise a plurality of first grooves and a plurality of second grooves, the micro components comprises a plurality of first micro components and a plurality of second micro components, a configuration of each of the first micro components corresponds to a configuration of each of the first grooves, a configuration of each of the second micro components corresponds to a configuration of each of the second grooves, and the configuration of each of the first grooves is different from the configuration of each of the second grooves.

3. The method according to claim 2, wherein the at least one electromagnetic force comprises a first electrostatic force and a second electrostatic force, and the step of providing the at least one electromagnetic force comprises:
applying voltage on some of the metal contacts which the first grooves expose, so as to generate the first electrostatic force toward the first grooves; and
applying voltage on some of the metal contacts which the second grooves expose, so as to generate the second electrostatic force toward the second grooves, wherein the electrode of each of the first micro components has opposite electrical polarity to the first electrostatic force, and the electrode of each of the second micro components has opposite electrical polarity to the second electrostatic force.

4. The method according to claim 1, wherein the at least one electromagnetic force is stronger than a sum of force acting on one of the micro components due to gravity and force between the one of the micro components and the droplet.

5. The method according to claim 1, wherein a diameter of the droplet is larger than or equal to a maximum size of one of the micro components.

6. The method according to claim 1, further comprising:
disposing an electrically conductive layer on the electrode of each of the micro components and/or each of the metal contacts before the droplet containing the micro components is provided, wherein the droplet is electrically non-conductive.

7. The method according to claim 1, further comprising:
providing another droplet on the first mounting surface; and
removing the another droplet so as to remove some of the micro components, which is fitted into respective grooves, from the first mounting surface.

8. The method according to claim 7, wherein the droplet and the another droplet are formed by different liquids.

9. The method according to claim 1, further comprising:
inspecting whether the micro components, which are fitted into respective grooves, function normally, wherein the at least one electromagnetic force is provided toward each of the grooves;
when an abnormal functioning micro component is discovered, stopping providing the at least one electromagnetic force toward the groove where the abnormal functioning micro component is fitted; and
removing the abnormal functioning micro component from the first mounting surface.

* * * * *